United States Patent
Yamamoto

(10) Patent No.: US 6,753,730 B2
(45) Date of Patent: Jun. 22, 2004

(54) DIFFERENTIAL AMPLIFIER AND FILTER CIRCUIT USING THE SAME

(75) Inventor: Takeshi Yamamoto, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 39 days.

(21) Appl. No.: 10/393,916

(22) Filed: Mar. 24, 2003

(65) Prior Publication Data

US 2003/0206061 A1 Nov. 6, 2003

Related U.S. Application Data

(62) Division of application No. 09/817,043, filed on Mar. 27, 2001, now Pat. No. 6,552,611.

(30) Foreign Application Priority Data

Mar. 27, 2000 (JP) ........................................ 2000-086381

(51) Int. Cl.[7] .............................................. H03F 3/45
(52) U.S. Cl. ...................... 330/253; 330/254; 330/257; 330/261
(58) Field of Search ................................ 330/253, 254, 330/257, 261

(56) References Cited

U.S. PATENT DOCUMENTS

| | | | |
|---|---|---|---|
| 5,126,974 A | 6/1992 | Sasaki et al. | |
| 5,162,751 A | 11/1992 | Blanken et al. | |
| 5,596,289 A | * 1/1997 | Liu | ............. 330/253 |
| 5,805,011 A | 9/1998 | Comino | |
| 5,872,483 A | 2/1999 | Kimura | |
| 5,990,741 A | 11/1999 | Yamamoto | |
| 6,552,611 B2 | * 4/2003 | Yamamoto | ................. 330/253 |

FOREIGN PATENT DOCUMENTS

| | | |
|---|---|---|
| JP | 92008 | * 3/1990 |
| JP | 2-276094 | 11/1990 |
| JP | 8-84029 | 3/1996 |
| KR | 0178883 | 11/1998 |

OTHER PUBLICATIONS

Hsing et al. "Design of Current Mode Operational Amplifier with Differential–Input and Differential Output" 1997 IEEE International Symposium on Circuits and Systems, vol. 1 Jun. 9–12, 1997 pp 153–156.*

* cited by examiner

Primary Examiner—Michael B. Shingleton
(74) Attorney, Agent, or Firm—Oblon, Spivak, McClelland, Maier & Neustadt, P.C.

(57) ABSTRACT

A differential amplifier is constructed in such a manner that a unit includes the sources of a first and a second MOS transistor and the drain of a third MOS transistor are connected to each other, these MOS transistors being of the same conductivity type, the other end of a current source whose one end is connected to a power supply or the ground is connected to the drain of the first MOS transistor and the gate of the third MOS transistor, and the source of the third MOS transistor is connected to the power supply or the ground. Two units of the differential amplifier are connected in parallel. The differential amplifier supplies a differential input signal to gates of the first and second units and obtains the output from drains of the first and second units. Two units of the differential amplifier are connected in parallel, with the input terminals cross-coupled with each other, thereby constructing a differential amplifier of the completely differential type.

10 Claims, 16 Drawing Sheets

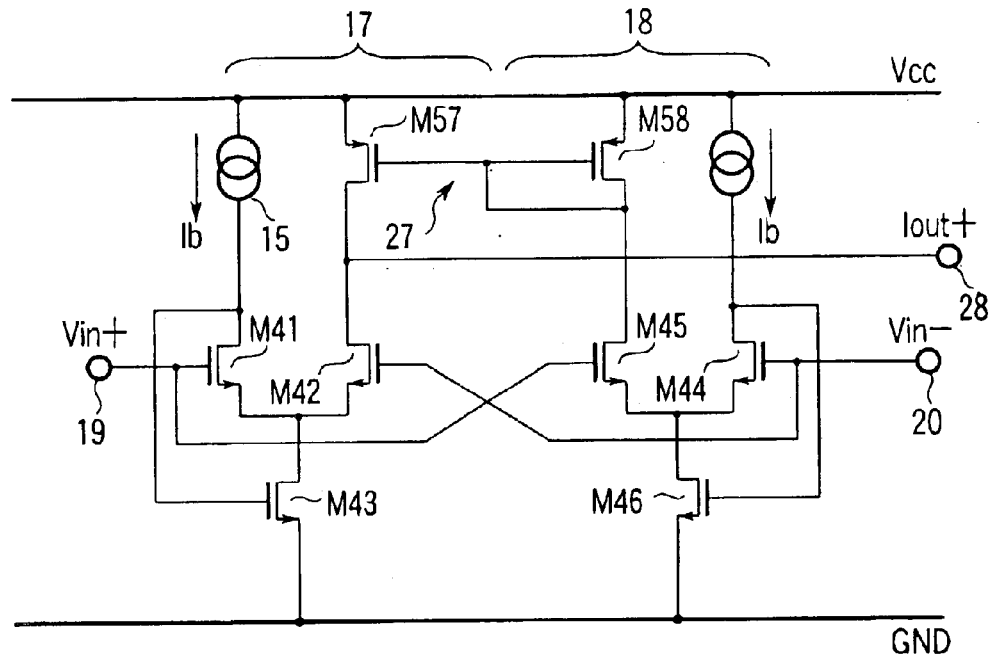
F I G. 14
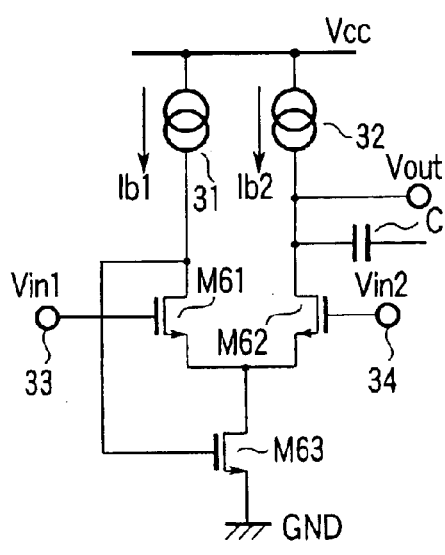
F I G. 15
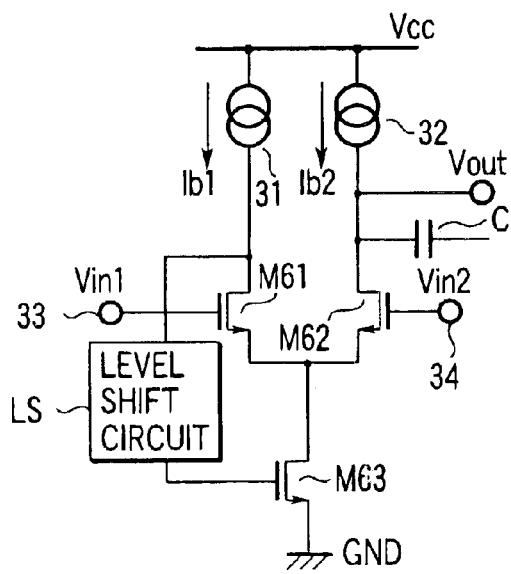
F I G. 16

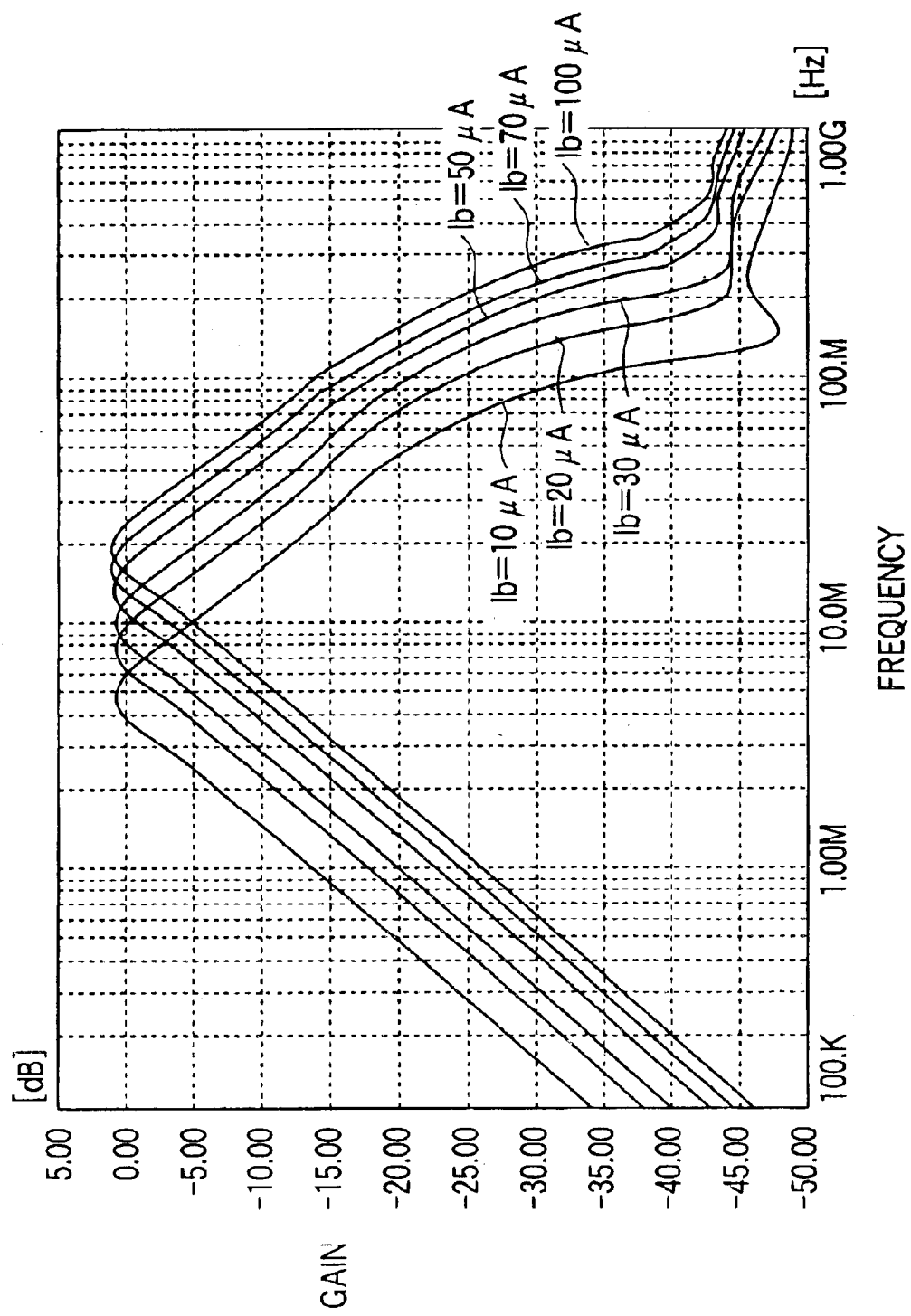
F I G. 22

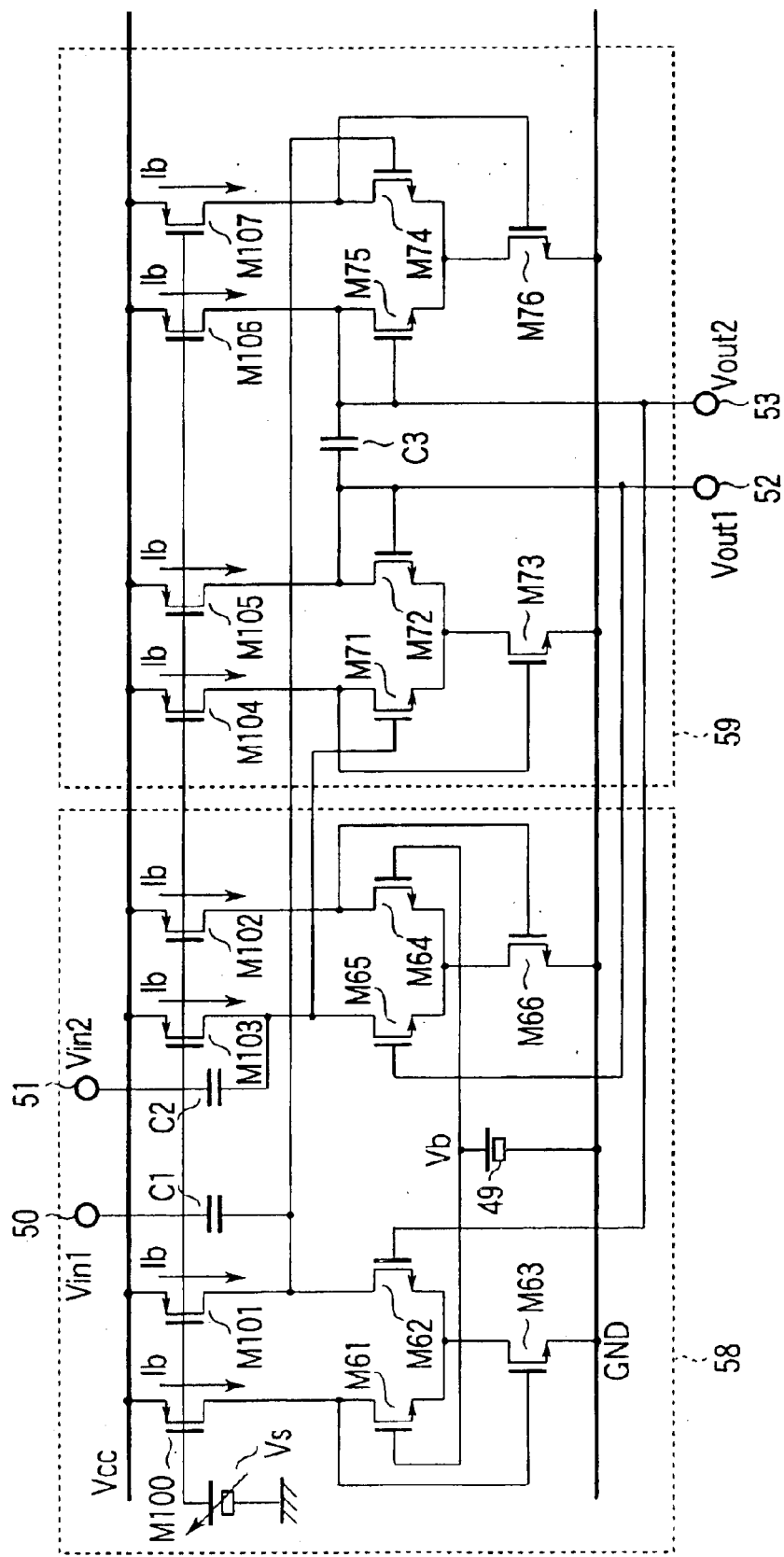
F I G. 23

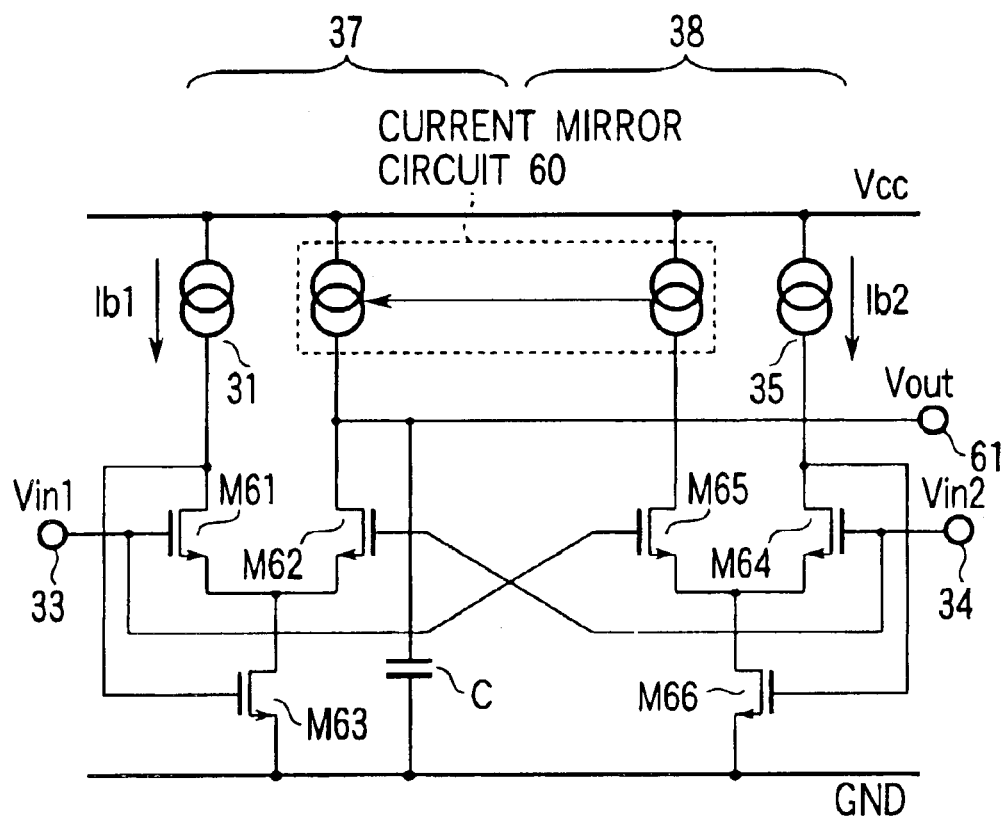
F I G. 24

DIFFERENTIAL AMPLIFIER AND FILTER CIRCUIT USING THE SAME

CROSS-REFERENCE TO RELATED APPLICATIONS

This application is a divisional application of, and claims priority to, Ser. No. 09/817,043 filed Mar. 27, 2001 now U.S. Pat. No. 6,552,611 and claims priority to Japanese Application No. JP 2000-086381 filed Mar. 27, 2000. The entire contents of the parent application is incorporated herein by reference

CROSS-REFERENCE TO RELATED APPLICATIONS

This application is based upon and claims the benefit of priority from the prior Japanese Patent Application No. 2000-086381, filed Mar. 27, 2000, the entire contents of which are incorporated herein by reference.

BACKGROUND OF THE INVENTION

This invention relates to a differential amplifier which is fundamental in processing an analog signal in a MOS integrated circuit and to a filter circuit using the differential amplifier as a transconductance circuit.

To process an analog signal with high quality, it is necessary to cause the circuit to operate linearly. In general, however, it is difficult to realize an analog circuit with good linearity using a CMOS circuit. The reason for this is that the approach of expanding the linear range using resistances is not effective, because the MOS transistor has a lower gm (transconductance) than that of the bipolar transistor, and that the MOS transistor itself has a square-law characteristic in the normal operating region. Thus, the approach of realizing an amplifier with a wide linearity by taking advantage of the square-law characteristic of the MOS transistor has been proposed.

A basic one of this approach has been proposed in, for example, Jpn. Pat. Appln. KOKAI Publication No. 10-65461. The principle of the approach is shown in FIG. 1. The circuit of FIG. 1 is composed of a pair of MOS transistors M1, M2 whose sources are grounded. Consider a case where a complete differential signal is inputted to the circuit. It is assumed that both of the transistors M1 and M2 are operating in the saturation region (pinch-off region). To simplify the explanation, the short channel effect is not taken into consideration. At this time, using the values of the main parameters, k and Vth, the characteristic of each of the MOS transistors M1, M2 can be expressed as:

$$I=(k/2)(V_{GS}-V\text{th})^2 \quad (1)$$

where I is the drain current, $V_{GS}$ is the gate-source voltage, Vth is the threshold voltage inherent to the transistor, and k is the constant $\mu C_{OX}W/L$ where W is the gate width, L is the gate length, $C_{OX}$ is the gate capacity, and $\mu$ is the carrier mobility of the channel.

Using equation (1), the descriptive equations for the operation of the transistors M1 and M2 can be expressed as follows:

$$M1: I\text{out}+=(k/2)(V_{GS1}-V\text{th})^2 \quad (2)$$

$$M2: I\text{out}-=(k/2)(V_{GS2}-V\text{th})^2 \quad (3)$$

Subtracting equation (3) from equation (2) gives:

$$I\text{out}+ - I\text{out}- = (k/2)(V_{GS1}+V_{GS2}-2V\text{th})(V_{GS1}-V_{GS2}) \quad (4)$$

$$= k(VB-V\text{th})V\text{in}$$

where $V_{GS1}$, $V_{GS2}$ are the gate-source voltages of the MOS transistors M1 and M2, respectively, Vin is the input signal (differential input voltage), and $V_B$ is the midpoint voltage of the input signal. Because the input signal is assumed to be a complete differential signal, the relationship of $V_{GS1}+V_{GS2}=2V_B$=constant is used.

Since $k(V_B-V\text{th})$ is constant in equation (4), it is understood that the differential current of the output is completely proportional to the input voltage. That is, taking out the output in the form of the differential current enables the completely linear characteristic to be realized as the input/output characteristic, while assuring a wider linearity. Actually, as long as the input conditions are fulfilled, the linear range can be expanded to the extent that the transistors M1 and M2 are kept in the saturation region.

Another necessary condition for processing an analog signal with high accuracy is that the differential circuit has a high common mode rejection capability. In the circuit of FIG. 1, which provides differential operation, the common mode gain is obviously equal to the voltage gain of the single common-source MOS transistor and very high. In other words, the circuit has a low common mode rejection capability. Thus, when the input signal includes no in-phase components, there is no problem. When the input signal includes in-phase components, however, the components are amplified and appear at the output. Therefore, when the circuit shown in FIG. 1 is used as it is, its application is limited because its common mode rejection capability is low.

To overcome this disadvantage, a circuit system with a high common mode rejection capability has been proposed in Jpn. Pat. Appln. KOKAI Publication No. 8-32372 (or Japanese Pat. No. 2638492). The circuit described in the publication is shown in FIG. 2. A general approach of providing a circuit with a high common mode rejection capability is to construct the input stage using a differential circuit. In the conventional circuit of FIG. 2, the input stage is composed of two pairs of differential circuits: one pair includes MOS transistors M11 and M12 and the other pair includes MOS transistors M13 and M14. The coupled point of the sources of the transistors M11 and M12 is biased by a current source 10. The coupled point of the sources of the transistors M13 and M14 is biased by a current source 11.

With this configuration, an input signal voltage of V1 is normally distributed to the MOS transistors M11 and M12 and the MOS transistors M13 and M14 in the form of a variation in the gate-source voltage. Since the ratio of the distribution varies dynamically according to the input signal voltage V1, the linear output for the input cannot be drawn from the drain current of each pair. As a result, a linearizing approach as shown in the circuit of FIG. 1 cannot be applied.

In FIG. 2, to overcome this problem, the drain current of the MOS transistor M12 is returned by a current mirror circuit composed of MOS transistors M15 and M16 and another current mirror circuit composed of MOS transistors M18 and M17, and is added to the current source 10. In addition, the drain current of the MOS transistor M13 is returned by a current mirror circuit composed of MOS transistors M20 and M21 and another current mirror circuit composed of MOS transistors M23 and M22, and is added to the current source 11.

With this configuration, the drain current of the MOS transistor M12 including a variation in the signal is all supplied from the MOS transistor M17, with the result that the current flowing through the MOS transistor M11 becomes a constant current I0. Similarly, the drain current of the MOS transistor M13 including a variation in the signal is all supplied from the MOS transistor M22, with the result that the current flowing through the MOS transistor M14 becomes a constant current I0. Consequently, the gate-source voltage of the MOS transistor M11 depends only on the constant current I0 and becomes a constant voltage independent of the input signal voltage V1. The gate-source voltage of the MOS transistor M14 depends only on the constant current I0 and becomes a constant voltage independent of the input signal voltage V1.

Therefore, all the input signal voltage V1 is applied between the gate and source of the MOS transistor M12 and between the gate and source of the MOS transistor M13. The voltage applied between the gate and source of each of the MOS transistors M11 to M14 is expressed by the following equations:

$$M11: I0=(k/2)(V_{GS11}-V\text{th})^2 \quad (5)$$

$$M12: Id12=(k/2)(V_{GS11}-V1-V\text{th})^2 \quad (6)$$

$$M13: Id13=(k/2)(V_{GS14}+V1-V\text{th})^2 \quad (7)$$

$$M14: I0=(k/2)(V_{GS14}-V\text{th})^2 \quad (8)$$

where Id12 and Id13 are the drain currents of the MOS transistors M12 and M13.

From equation (5) and equation (8), $V_{GS14}=V_{GS11}$ holds. Taking this into account, subtracting equation (6) from equation (7) gives:

$$Id13-Id12=2k(V_{GS11}-V\text{th})V1 \quad (9)$$

Since $V_{GS11}$=constant, equation (9) means that the differential current of the output is completely proportional to the input voltage, as equation (4) does. That is, drawing the output in the form of the differential current enables the completely linear characteristic to be realized as the input/output characteristic with a wide linearity.

Transistors M19 and M24 are used for output. The drains of the transistors M19 and M24 are connected to each other, thereby applying the input signal voltage V1 of opposite phase to a differential circuit composed of the transistors M11, M12, M15, M16, M17, and M18 and the current source 10 and to a differential circuit composed of the transistors M13, M14, M20, M21, M22, and M23 and the current source 11, and doing the sum of the output currents (the drain currents Id12 and Id13 of the MOS transistors M12 and M13) of the differential circuits, which produces an output current Isq.

In this way, the circuit of FIG. 2 has the two advantages of having a high common mode rejection ratio because the input stage is composed of differential circuits and of having a good linearity over a wide input voltage range, which has been difficult to realized using conventional CMOS circuits.

This circuit, however, has disadvantages in that it has two current mirror circuits on one side, that is, four current mirror circuits on both sides and that a poor accuracy of these current mirror circuits would degrade the linearity. Moreover, the current mirror circuits are liable to degrade the frequency characteristic, causing the problem: the effect of correcting the linearity decreases in the high-frequency, making distortion liable to occur. Other problems are that the size of the circuit increases and the drawn current dissipation becomes larger, depending on the addition of the current mirrors.

As described above, although the circuit of FIG. 2 can theoretically solve the problems the conventional CMOS differential amplifier has, it has many practical-use problems when being applied to practical circuits.

In integrated circuits, to filter an analog signal, it is common practice to use a filter circuit constructed by combining several integrators composed of transconductance circuits (hereinafter, referred to as gm circuits) and capacitors. To filter an analog signal with low noise and low distortion, each gm circuit has to have a wide input dynamic range and a good linearity. As described above, however, it has been generally difficult to realize an analog circuit with a good linearity using a conventional CMOS circuit configuration.

For example, consider a case where a general differential circuit as shown in FIG. 3 is used as a gm circuit constituting a filter circuit. The circuit is composed of a pair of MOS transistors M31 and M32 whose sources are connected to each other and a MOS transistor M33 (or a current source 2Ib) for biasing the MOS transistors M31, M32. The drain current Id31 of the MOS transistor M31 is returned by a current mirror circuit 12 and added to the drain current Id32 of the MOS transistor M32. Then, the difference current between the drain current Id31 and Id32 is used as an output current Iout. Using the output current Iout, a capacitor CA is charged or discharged for integral action.

Consider a case where a differential signal is inputted to the circuit. It is assumed that both transistors have the same size and shape and are operating in the saturation region (or the pinch-off region). For the sake of simplicity, the short channel effect is not taken into consideration. In the saturation region, the characteristic of the MOS transistor can be expressed by the above equation (1). The descriptive equations for the MOS transistors M31 and M32 are expressed by the following equations (10) and (11):

$$M31: Id31=(k/2)(V_{GS31}-V\text{th})^2 \quad (10)$$

$$M32: Id32=(k/2)(V_{GS32}-V\text{th})^2 \quad (10)$$

Here, the following equations hold:

$$V_{GS31}-V_{GS32}=V\text{in} \quad (12)$$

$$Id31-Id32=I\text{out} \quad (13)$$

where $V_{GS31}$ and $V_{GS32}$ are the gate-source voltages of the MOS transistors M31 and M32, and Vin is the differential input voltage.

Solving these equations gives:

$$I\text{out}=kV\text{in} (V_{GS31}-V\text{th}-V\text{in}/2) \quad (14)$$

$$2Ib=k\{(V_{GS31}-V\text{th})^2-V\text{in} (V_{GS31}-V\text{th})+V\text{in}^2/2\} \quad (15)$$

Substituting $V_{GS31}$ obtained by solving equation (15) gives the output current Iout for the input voltage Vin, which is expressed by a very complicated equation. The reason for this is that $V_{GS31}$ and $V_{GS32}$ vary with the value of Vin. The fact that the output current Iout is expressed by such a complicated equation means that the output has complex distortion components.

Consequently, even if a filter circuit is constructed using a differential circuit as shown in FIG. 3 as a gm circuit, distortion is liable to occur and therefore it is impossible to do filtering while keeping a high-quality.

As described above, although some of the conventional differential amplifiers (e.g., transconductance circuits) enable a wide linearity and a high common mode rejection ratio, they have disadvantages in that their linearity is liable to deteriorate, their linearity is poor in the high-frequency region, their circuit size is large, and the dissipation current is large. It is therefore desired that they should be improved.

Furthermore, when a conventional differential circuit is used as a gm circuit serving as a component element of a continuous-time filter circuit composed of CMOS elements, this causes the problems that distortion is liable to occur and it is impossible to do filtering, while maintaining the signal performance.

BRIEF SUMMARY OF THE INVENTION

A first object of the present invention is to provide a multipurpose differential amplifier which has not only a wide linearity and a high common mode rejection ratio but also a good linearity, an excellent high-frequency characteristic, a small circuit size, and a small dissipation current.

A second object of the present invention is to provide a filter circuit which has a wide linearity, a good linearity, and an excellent high-frequency characteristic.

The first object is accomplished by providing a differential amplifier comprising: a first current source one end of which is connected to a power supply or a ground; a first MOS transistor of a first conductivity type whose drain is connected to the other end of the first current source and whose gate is connected to a first input terminal; a second MOS transistor of the first conductivity type whose source is connected to a source of the first MOS transistor and whose gate is connected to a second input terminal; a third MOS transistor of the first conductivity type whose drain is connected to the sources of the first and second MOS transistors, whose source is connected to the ground or the power supply, and whose gate is coupled to the other end of the first current source; a second current source one end of which is connected to the power supply or the ground; a fourth MOS transistor of the first conductivity type whose drain is connected to the other end of the second current source and whose gate is connected to the first input, terminal; a fifth MOS transistor of the first conductivity type whose source is connected to a source of the fourth MOS transistor and whose gate is connected to a third input terminal; and a sixth MOS transistor of the first conductivity type whose drain is connected to the sources of the fourth and fifth MOS transistors, whose source is connected to the ground or the power supply, and whose gate is coupled to the other end of the second current source, wherein a differential signal is inputted to the second and third input terminals, a voltage substantially equal to the DC voltage of the differential signal is inputted to the first input terminal, and a differential output is obtained from drains of the second and fifth MOS transistors.

The first object is further accomplished by providing a differential amplifier comprising: a first current source one end of which is connected to a power supply or a ground; a first MOS transistor of a first conductivity type whose drain is connected to the other end of the first current source and whose gate is connected to a first input terminal; a second MOS transistor of the first conductivity type whose source is connected to a source of the first MOS transistor and whose gate is connected to a second input terminal; a third MOS transistor of the first conductivity type whose drain is connected to the sources of the first and second MOS transistors, whose source is connected to the ground or the power supply, and whose gate is coupled to the other end off the first current source; a second current source one end of which is connected to the power supply or the ground; a fourth MOS transistor of the first conductivity type whose drain is connected to the other end of the second current source and whose gate is connected to a third input terminal; a fifth MOS transistor of the first conductivity type whose source is connected to a source of the fourth MOS transistor and whose gate is connected to the second input terminal; and a sixth MOS transistor of the first conductivity type whose drain is connected to the sources of the fourth and fifth MOS transistors, whose source is connected to the ground or the power supply, and whose gate is coupled to the other end of the second current source, wherein a differential signal is inputted to the first and third input terminals, a voltage substantially equal to the DC voltage of the differential signal is inputted to the second input terminal, and a differential output is obtained from the drains of the second and fifth MOS transistors.

With these circuit configurations, the input signal is inputted as the voltage between the gates of a pair of MOS transistors, a differential pair. Since one MOS transistor of the differential pair is biased with a constant current, the gate-source voltage is constant. As a result, the input signal is applied only to the other MOS transistor. The latter MOS transistor operates in the same manner as a commonsource transistor does. Its operating point, however, does not depend on the input signal voltage and is determined only by the current source.

Consequently, a differential amplifier of the present invention, which is constructed by combining two units of an amplifier that performs amplification independent of the DC voltage of the input signal and which carries out differential operation, produces the same effect as that of a differential amplifier composed of conventional common source transistor pairs. This realizes a circuit that has a good linearity over a wide input range. Moreover, the advantage that the operating point of each MOS transistor in two sets of differential pairs does not depend on the input signal voltage and is determined only by the current source is maintained, which achieves a high common mode rejection ratio.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14 is a circuit diagram to help explain another differential amplifier according to the present invention;

FIGS. 15 to 17 are circuit diagrams showing the configuration of a differential amplifier used as a transconductance circuit in a filter circuit to help explain a second embodiment of the present invention;

FIG. 22 is a characteristic diagram showing the frequency characteristic of the filter circuit shown in FIG. 21;

FIG. 23 is a circuit diagram of a concrete configuration of a secondary BPF (band-pass filter) shown in FIG. 21;

FIG. 24 is a circuit diagram showing the configuration of a differential amplifier used as a transconductance circuit in a filter circuit to help explain a fourth embodiment of the present invention;

DETAILED DESCRIPTION OF THE INVENTION

[First Embodiment]

Figure 1:
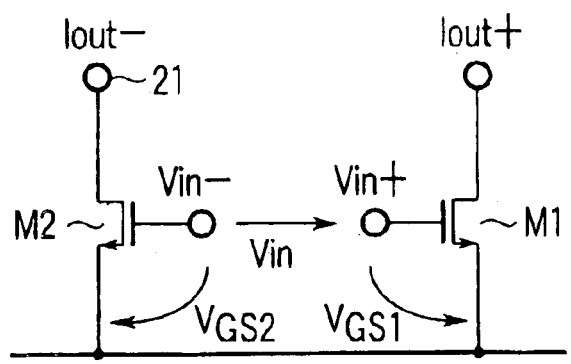
FIG. 1 is a circuit diagram to help explain a conventional differential amplifier.
Figure 3:
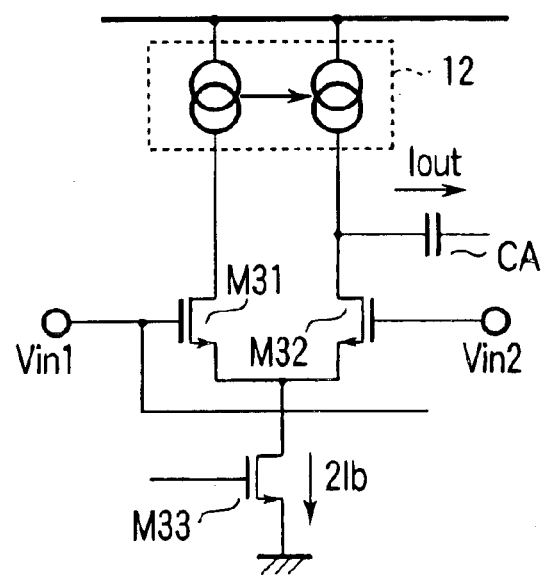
FIG. 3 is a circuit diagram showing an example of the configuration of a conventional differential amplifier used as a transconductance circuit in a filter circuit.

A differential amplifier according to a first embodiment of the present invention will be explained by reference to FIGS. 4 to 6. A circuit shown in FIG. 4, which helps explain the principle of the operation of the differential amplifier according to the present invention, is the most basic differential amplifier composed of NMOS (n-channel MOS) transistors M41 to M43 and a current source 15. In the circuit, differential input signals Vin1 and Vin2 are supplied to an input terminal 13 connected to the gate of a differential transistor M41 and an input terminal 14 connected to the gate of a differential transistor M42, respectively, thereby producing an output current Iout at the drain of the transistor M42. The bias current Ib of the circuit is supplied from the current source 15 to the drain of the transistor M41, which makes the current flowing through the transistor M41 constant at all times.

The drain current ratio of the differential transistor pair of M41 and M42 is almost determined by the voltage difference between the differential input signals Vin1 and Vin2. On the other hand, the drain of the transistor M41 is connected to the gate of common-source transistor M43 and whose drain is connected to the source common connection mode of the transistors pair of M41 and M42. As a result, with a differential voltage between Vin1 and Vin2, feedback is applied to the gate of the transistor M43 so that the drain current of the transistor M41 may be Ib.

Since the current flowing through the transistor M41 is constant, the gate-source voltage $V_{GS41}$ of the transistor M41 is constant, with the result that the source common connection mode voltage of the transistors M41 and M42 is fixed at a voltage constantly lower than Vin1 by a specific voltage. Thus, when the average of the differential voltage between Vin1 and Vin2 is 0, the transistor M42 is biased with the voltage drop. If the channel length/channel width ratio and characteristics are equal, the DC current in the transistor M42 becomes equal to Ib. Furthermore, since the gate-source voltage of the transistor M41 is constant, the differential voltage between Vin1 and Vin2 is all applied to the transistor M42.

From the viewpoint of alternating current, the resulting operation is equivalent to the operation of the common-source transistor using Vin2−Vin1 as the input voltage. What differs from the operation of a simple common-source transistor is that the transistor M42 can be biased using an arbitrary current Ib independent of the input, which enables the common mode voltages to be rejected from the input.

It is assumed that the transistors M41 and M42 have the same size and shape and are operating in the saturation region (or the pinch-off region). For the sake of simplicity, the short-channel effect is not taken into consideration. In this case, the relationship between voltage Vin1, voltage Vin2, and current Iout is expressed by the following equations:

$$M41: Ib = (k/2)(V_{GS41} - Vth)^2 \quad (16)$$

$$M42: Iout = (k/2)(Vin2 - Vin1 + V_{GS41} - Vth)^2 \quad (17)$$

$$= (k/2)\left(Vin1 + \sqrt{2Ib/k}\right)^2$$

where Vin=Vin2−Vin1.

Figure 4:
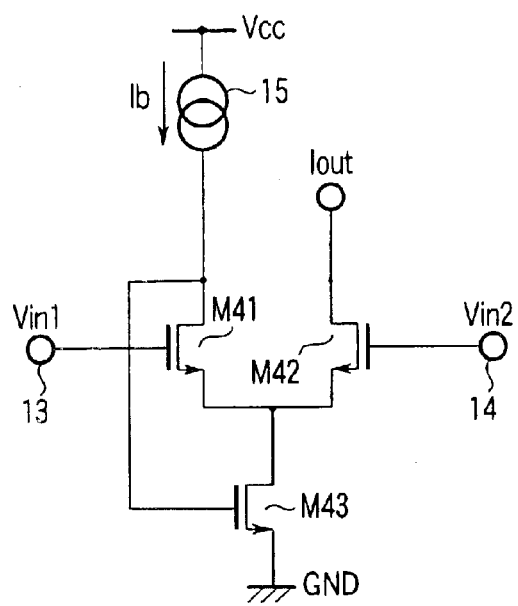
FIGS. 4 to 6 are circuit diagrams to help explain differential amplifiers according to a first embodiment of the present invention.

While in the circuit of FIG. 4, the basic differential transistors M41, M42 and transistor M43 are each made of NMOS, the power supply Vcc may be replaced with the ground GND, the ground GND be replaced with the power supply Vcc, and the NMOS transistors be replaced with PMOS (p-channel MOS) transistors, which will achieve the same operation. Although explanation has been given on the assumption that the differential input signals Vin1, Vin2 are inputted to the input terminals 13, 14, an input signal varying with time may be supplied to either the input terminal 13 or 14 and a bias voltage equal to, for example, the DC voltage of the input signal be supplied to the other input terminal.

Figure 5:
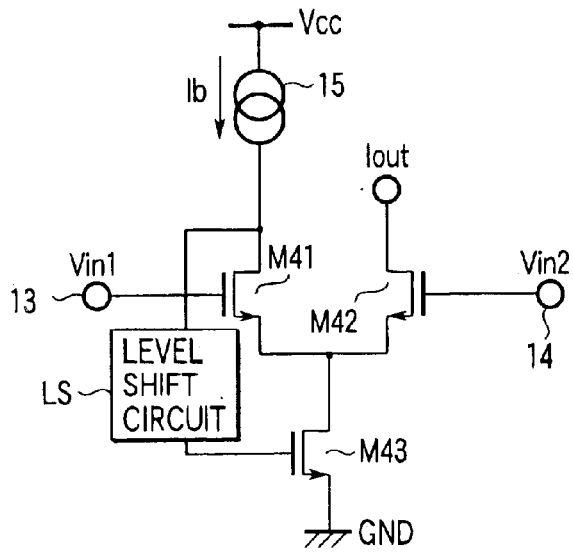

In a circuit shown in FIG. 5, a level shift circuit LS is inserted between the drain of the transistor M41 and the gate of the transistor M43 in the circuit of FIG. 4. The circuit of FIG. 4 is based on the assumption that the transistors M41 and M42 operate in the saturation region. The gate-source voltage of the transistor M43 is determined by the current the transistor M43 needs. The drain voltage of transistor M41 is determined by the gate-source voltage. When the level of the input signal Vin1 is high, the source common connection mode voltage of the transistor M41 rises, preventing a sufficient drain-source voltage from being assured at transistor M41. This problem narrows the dynamic range of the input, decreasing the linear range.

To avoid the problem, the level shift circuit LS is provided. Use of the level shift circuit LS causes the drain voltage of transistor M41 to rise by a voltage equivalent to the level shift voltage produced by the level shift circuit LS, giving so much more a margin to the drain-source voltage, which suppresses a decrease in the linear range. This assures a low distortion operation, even when rather a large amplitude signal is inputted.

Figure 6:
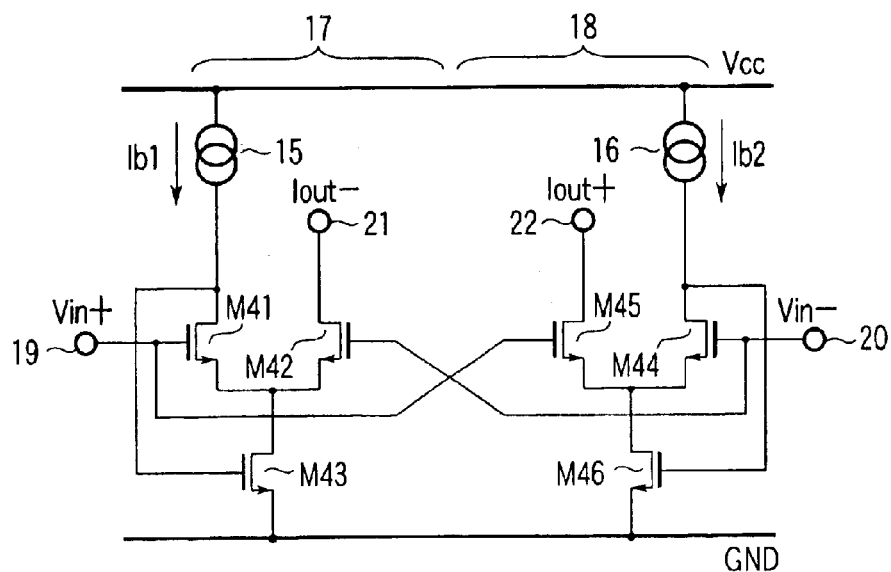

A circuit shown in FIG. 6 is a differential amplifier according to the first embodiment. In FIG. 6, two units of the circuit of FIG. 4 composed of the MOS transistors M41 to M43 and current source 15 are connected in parallel and the input terminals are cross-coupled with each other, thereby constructing a complete differential-type circuit. That is, a first differential circuit 17 composed of the transistors M41 to M43 and current source 15 and a second differential circuit 18 composed of the transistors M44 to M46 and current source 16 constitute the differential amplifier. The gates of the transistors M41 to M45 are connected to an input terminal 19, to which the positive signal Vin+ of a differential input signal is inputted. The gates of the transistors M42 and M44 are connected to an input terminal 20, to which the negative signal Vin− of the differential input signal is inputted. Then, the drain of transistor M42 of the first differential circuit 17 is connected to an output terminal 21 and the drain of transistor M45 of the second differential circuit 18 is connected to an output terminal 22, thereby producing an output current Iout− of a negative signal at the output terminal 21 and an output current Iout+ of a positive signal at the output terminal 22.

With this configuration, the output currents Iout+ and Iout− can be expressed using equation (17) as follows:

$$M42: Iout-=(k/2)(-Vin+\sqrt{(2Ib1/k)})^2 \quad (18)$$

$$M45: Iout+=(k/2)(Vin+\sqrt{(2Ib2/k)})^2 \quad (19)$$

Let Ib1=Ib2=Ib and calculating the output differential current Iout+−Iout− gives:

$$Iout+-Iout-=Vin \times \sqrt{(8kIb)} \quad (20)$$

This equation represents that the output differential current is completely proportional to the input voltage Vin. Under the condition that each transistor operates in the saturation region, equation (20) always holds, assuring a wide linear operation range. The conversion coefficient gm (or transconductance) of the input voltage into output current is determined by k and Ib as follows:

$$gm=\sqrt{(8kIb)} \quad (21)$$

As seen from this equation, gm is proportional to the square root of the bias current Ib.

Figure 2:
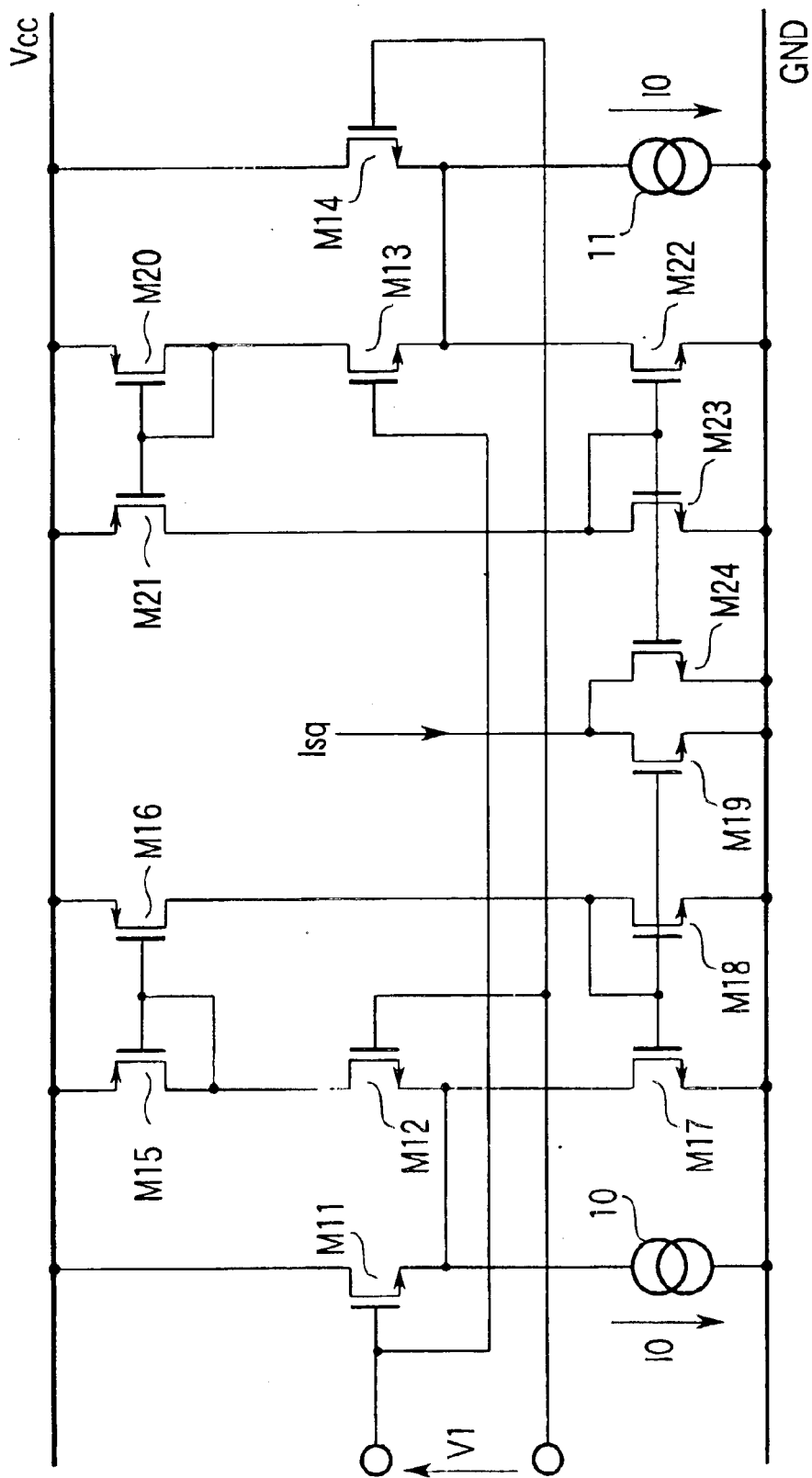
FIG. 2 is a circuit diagram to help explain a conventional improved differential amplifier.

Accordingly, gm can be controlled by changing the bias current. This applies to a variable gain amplifier. Since the circuit is constructed using two units of the differential circuit of FIG. 4, it is excellent in the capability of rejecting the in-phase components in the input signal, which is a characteristic of the differential circuit. Moreover, the circuit has all the advantages of the prior-art circuit shown in FIG. 2. Since it does not use many current mirror circuits as shown in FIG. 2, the linearity does not deteriorate due to variations in the manufacture of elements, and neither does the characteristic deteriorate. In addition, the number of elements is about half of that of the circuit of FIG. 2, which leads to the advantages that the circuit size is smaller and the dissipation current is less.

Figure 7:
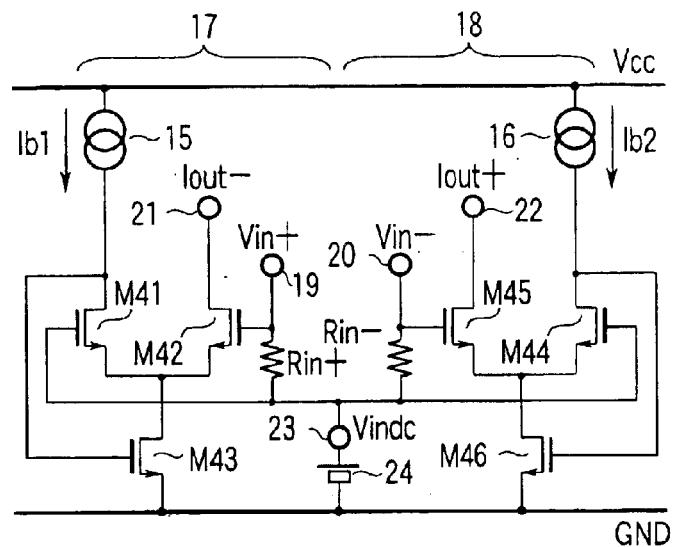
FIG. 7 is a circuit diagram of a modification of the differential amplifier shown in FIG. 6.

FIG. 7 shows a modification of the differential amplifier of FIG. 6. Although the circuit of FIG. 7 is the same as that of FIG. 6 in that the two differential amplifiers 17, 18 are connected in parallel to form a complete differential-type circuit but differs from the latter in that the positive signal and negative signal of the differential input signal and a voltage equal to the DC voltage of these differential signals are applied to the gates of transistors M41, M42, M44, and M45. Specifically, the gate of transistor M41 and that of transistor M44 are connected to an input terminal 23. A DC power supply 24 applies a reference voltage Vindc to the input terminal 23. The gate of transistor M42 is connected to the input terminal 19, to which the positive signal Vin+ is supplied. A resistance Rin+ is connected between the input terminal 19 and input terminal 23. In addition, the gate of transistor M45 is connected to the input terminal 20, to which the negative signal Vin− is supplied. A resistance Rin− is connected between the input terminal 20 and input terminal 23.

This configuration achieves basically the same operation except that gm is half of that in equation (21).

Figure 8:
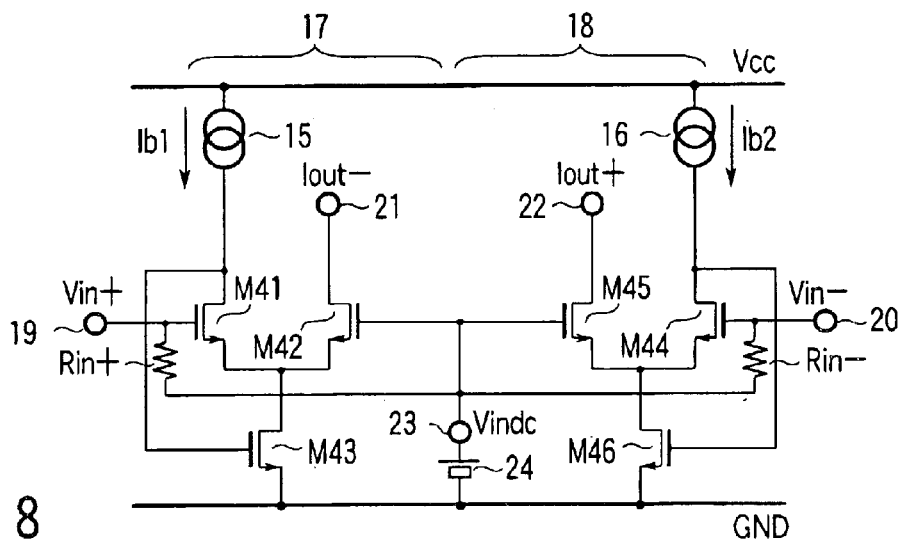
FIG. 8 is a circuit diagram of another modification of the differential amplifier shown in FIG. 6.

Constructing the circuit as shown in FIG. 8 enables the same operation as that of the circuits shown in FIGS. 6 and 7. In the differential amplifier of FIG. 8, the gate of transistor M42 and that of transistor M45 are connected to the input terminal 23. The DC power supply 24 applies a reference voltage Vindc to the input terminal 23. The gate of transistor M41 is connected to the input terminal 19, to which the positive signal Vin+ is supplied. A resistance Rin+ is connected between the input terminal 19 and input terminal 23. In addition, the gate of transistor M44 is connected to the input terminal 20, to which the negative signal Vin− is supplied. A resistance Rin− is connected between the input terminal 20 and input terminal 23.

Figure 9:
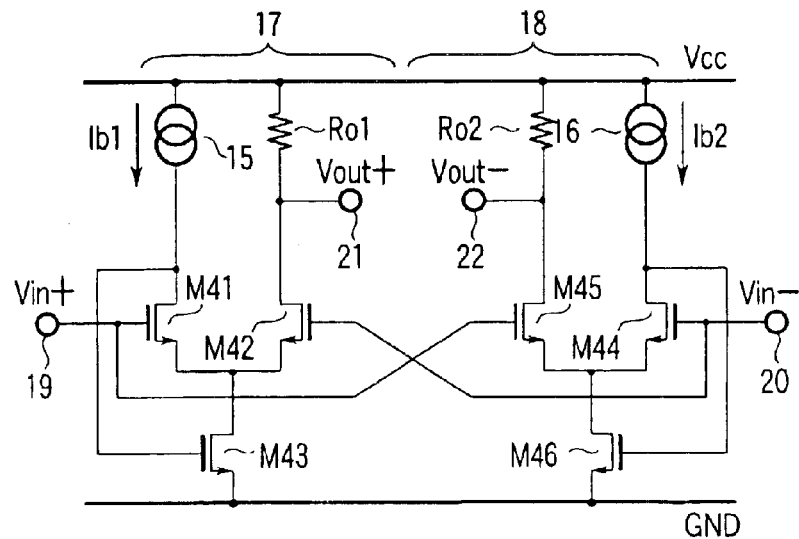
FIG. 9 is a circuit diagram of still another modification of the differential amplifier shown in FIG. 6.

FIG. 9 shows another modification of the differential amplifier of FIG. 6. Resistance Ro1 and resistance Ro2 are connected as loads to the current output terminals 21 and 22 of the circuit of FIG. 6, respectively, which produces a voltage output. The gain from the input to output of the circuit is the value obtained by multiplying gm in equation (21) by the value of the resistance of the load. Let Ro1=Ro2=Ro, then $$gain=R_0\sqrt{(8kIb)} \quad (22)$$

Actually, in any of the differential amplifiers, a resistance is connected to the output terminal as a load to obtain the voltage output.

Figure 10:
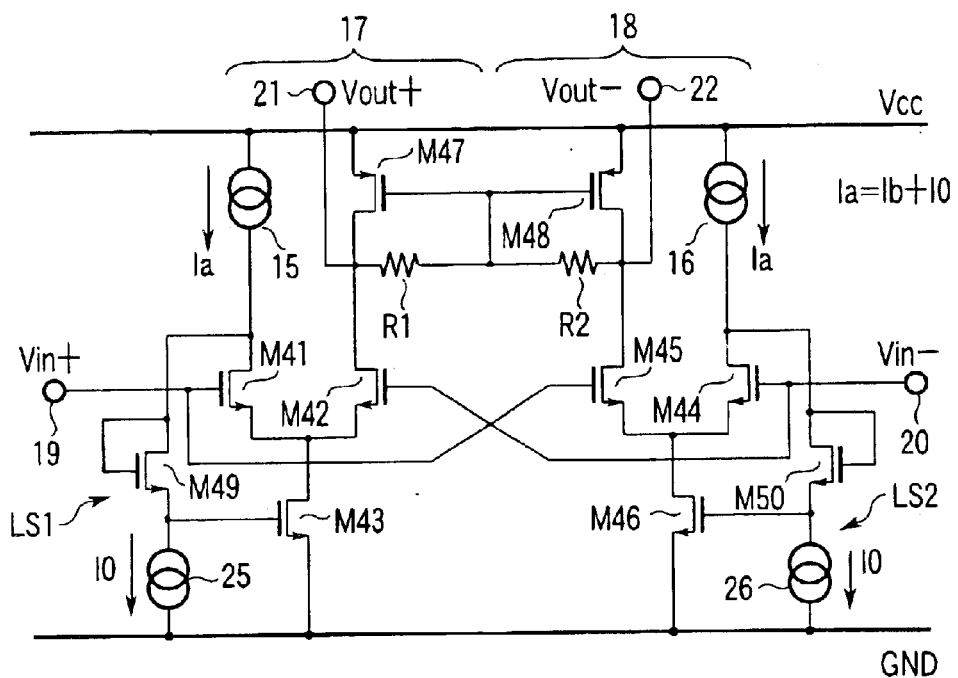
FIG. 10 is a circuit diagram of a modification of the differential amplifier shown in FIG. 9.

FIG. 10 shows a modification of the differential amplifier of FIG. 9. One modified point is that circuits of the type of FIG. 5 are used as the two differential circuits 17, 18 of the input stage. Specifically, the drain voltages of the transistors M41 and M44 are applied via level shift circuits LS1, LS2 for shifting the level by a specific voltage to the gates of the transistors M43 and M46, respectively, for supplying current to the differential circuits 17, 18. This makes the linear operation range of the two differential circuits 17, 18 of the input stage still wider.

The level shift circuits LS1 and LS2 are composed of transistors M49 and M50 whose drain and gate are short-circuited and current sources 25 and 26, respectively. The gate-source voltage generated by causing the current sources 25, 26 to supply current I0 to the respective transistors M49, M50 is used to shift the level by the value of the gate-source voltage. At this time, the current sources 15, 16 for supplying current from the power supply Vcc side to the differential circuits 17, 18 have a current value of Ia (Ia=Ib+Io) obtained by adding a level shift current of Io to the current Ib.

While in this example, transistors have been used for level shifting, resistances may be used instead of the transistors M49 and M50 for level shifting, which produces the same effect.

Moreover, it goes without saying that such a level shift circuit may be applied to other circuits in the same manner.

Another modified point is that PMOS transistors M47 and M48, in addition to the resistances R1, R2, are connected as loads to the current output terminals 21, 22. Specifically, the sources of the transistors M47, M48 are connected to the power supply Vcc and their drains are connected to the drains of the transistors M42, M45 and to the output terminals 21, 22, respectively, with their gates connected in common. One end of resistance R1 is connected to the gate common point of the MOS transistors M47, M48 and the other end of the resistance R1 is connected to the drains of the MOS transistors M42, M47. One end of resistance R2 is connected to the gate common point of the MOS transistors M47, M48 and the other end of the resistance R2 is connected to the drains of the MOS transistors M45, M48.

Since the DC voltage of the output is determined by the gate-source voltage of the transistors M47 and M48, even if the gain is changed by changing the output current Ia of the current sources 15, 16, the DC voltage will vary only a little. On the other hand, since the load resistance that determines the gain is almost determined only by the values of the resistances R1 and R2, a high gain can be realized.

Figure 11:
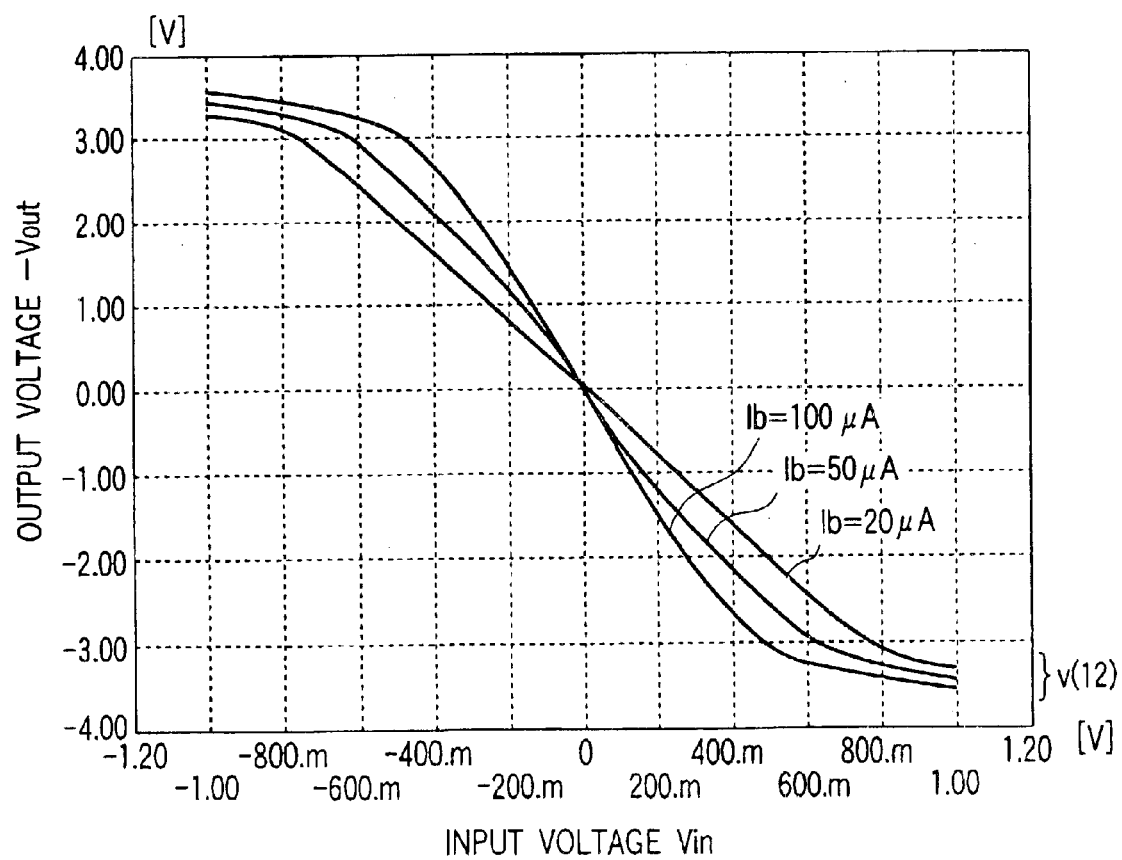
FIG. 11 is a characteristic diagram showing the input/output characteristic of the differential amplifier shown in FIG. 10.

FIG. 11 shows the input/output characteristic of the differential amplifier of FIG. 10. The abscissa axis indicates the input voltage Vin (=Vin+−Vin−) and the ordinate axis indicates the output voltage −Vout (=Vout−−Voug+). The power supply voltage is 5 V. Ib=20 $\mu$A, Ib=50 $\mu$A, and Ib=100 $\mu$A are used as the current values of the current sources 15, 16.

As seen from the FIG. 11, the range of the output voltage changing linearly with the input voltage is about ±3V, very wide. The slope of the straight line varies with the current value Ib of the current sources 15, 16 and is almost proportional to the square root of the current value Ib. Making use of this characteristic, each circuit according to the present invention may be used as a variable gain amplifier.

Figure 12:
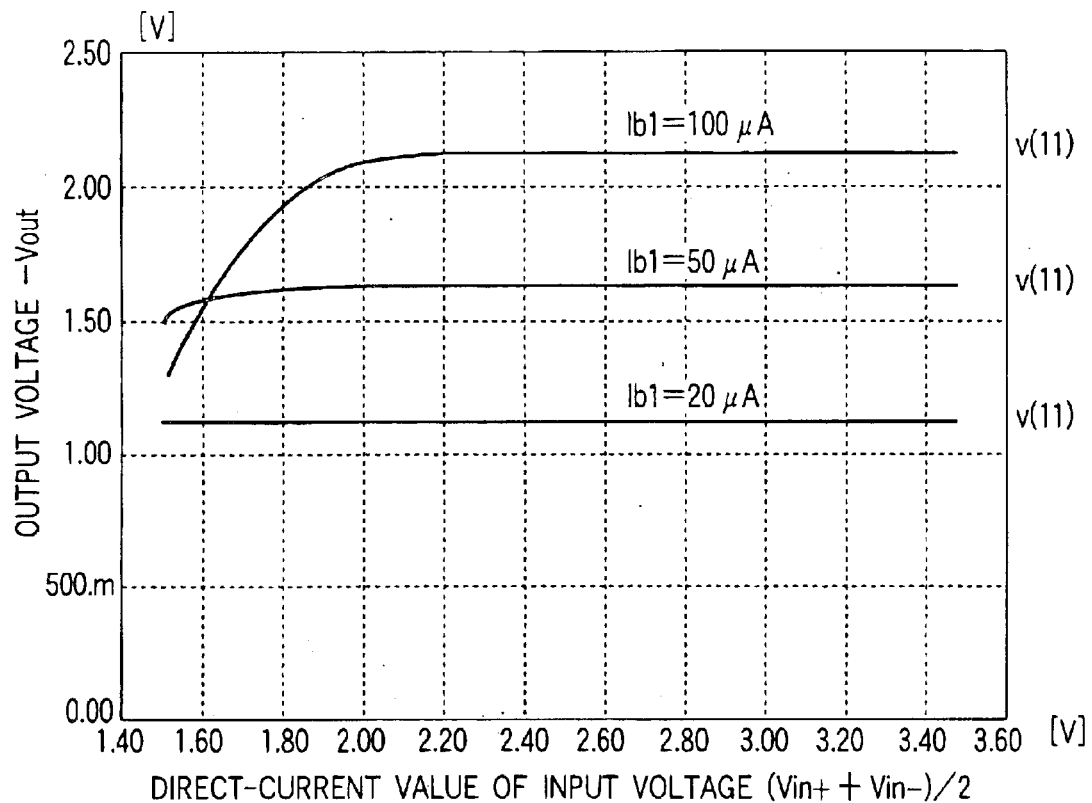
FIG. 12 is a characteristic diagram for the common mode input showing the dependence of the differential amplifier of FIG. 10 on the input voltage.

FIG. 12 shows the dependence of the differential amplifier of FIG. 10 on the input voltage. In FIG. 12, as the DC value (Vin++Vin−)/2 of the input voltage is varied under the condition that the input voltage Vin (Vin+−Vin−) is kept at −0.3V, the output voltage−Vout (=Vout−−Vin+) varies. In this case, too, Ib=20 $\mu$A, Ib=50 $\mu$A, and Ib=100 $\mu$A are used as the current values of the current sources 15, 16.

As seen from FIG. 12, the output voltage hardly depends on the input voltage, except for the low current values of the input voltage. The reason is that the drain voltages of the transistors M43 and M46 drop where the current value of the input voltage is low and they do not operate in the saturation region. In the other regions, the output voltage is almost flat. This means that the reject ratio of the common mode voltages is great in the actual operation of the circuit. As described above, the circuit according to the present invention completely eliminates the disadvantage of having a small common mode rejection ratio the circuit of FIG. 1 has.

Figure 13:
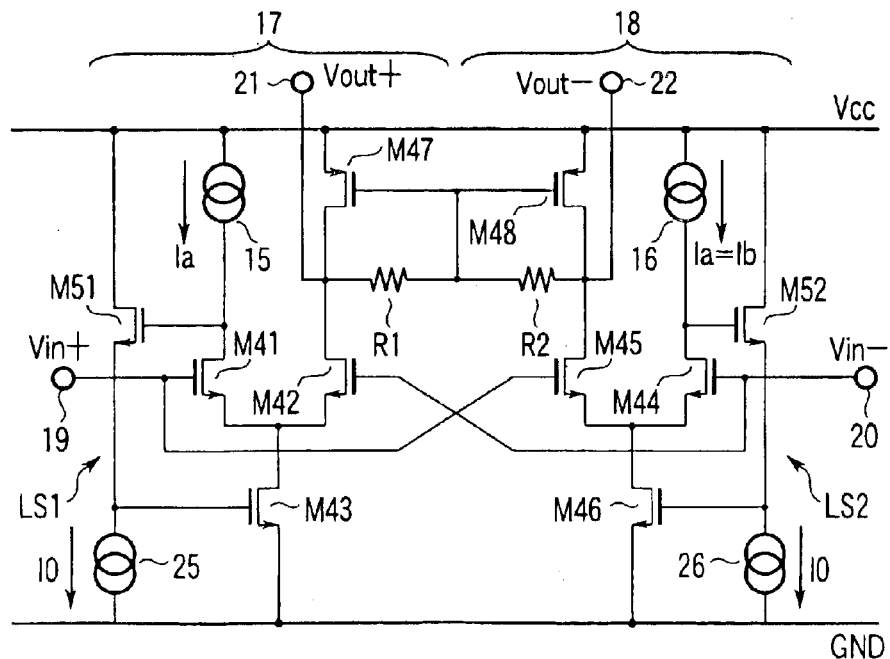
FIG. 13 is a circuit diagram of a modification of the differential amplifier shown in FIG. 10.

FIG. 13 shows a modification of the differential amplifier of FIG. 10. In FIG. 13, another configuration of the level shift circuits LS1 and LS2 is shown. The level shift circuits LS1 and LS2 are composed of NMOS transistors M51 and M52 and the current sources 25 and 26. The drain of transistor M51 is connected to the power supply Vcc and the source of transistor M51 is connected to the gate of transistor M43 and the current source 25. The gate of transistor M51 is connected to the coupled point of the current source 15 and transistor M41. The drain of transistor M52 is connected to the power supply Vcc and the source of transistor M52 is connected to the gate of transistor M46 and the current source 26. The gate of transistor M52 is connected to the coupled point of the current source 16 and transistor M44.

Because the remaining circuit configuration is the same as that of FIG. 10, the same parts are indicated by the same reference numerals and a detailed explanation of them will be omitted.

With such a configuration, causing current Io generated by the current sources 25, 26 to flow in the transistors M51, M52 makes the gate-source voltage develop. The level can be shifted by a voltage equivalent to the gate-source voltage. Moreover, since the currents flowing from the power supply Vcc into the source and drain of the transistors M51, M52 is caused to flow in the respective current sources 25, 26, this eliminates the effect of the current value Io of the current sources 25, 26 on the current value Ia=Ib of the current sources 15, 16 supplying current to the differential circuits 17, 18, which helps achieve high accuracy.

While in the circuit configuration using the two differential circuits 17, 18 shown in FIGS. 6 to 10, and 13, the complete differential configuration where all the inputs and outputs are differential has been used, all the inputs and outputs are not necessarily differential. For instance, as shown in FIG. 14, a current mirror circuit 27 composed of transistors M57 and M58 may be connected to the differential output terminals 21, 22, thereby producing a single output, which may be then outputted as current Iout+ at the output terminal 28. The single output configuration may, of course, be applied to other circuits in a similar manner.

[Second Embodiment]

Next, a case where a differential amplifier according to the first embodiment is applied as a transconductance circuit (gm circuit) to a filter circuit will be explained by reference to FIGS. 15 to 17. FIG. 15 is a circuit diagram to help explain the principle of operation when a differential amplifier of the present invention is applied to a transconductance circuit. The circuit of FIG. 15 is the most basic gm circuit of the present invention, which is composed of NMOS transistors M61 to M63, a capacitor C1, and current sources 31, 32. In the circuit, differential input signals Vin and Vin2 are supplied between an input terminal 33 connected to the gate of differential transistor M61 and an input terminal 34 connected to the gate of differential transistor M62, thereby producing an output current at the drain of the transistor M62. The current sources 31, 32 supply current Ib1 and current Ib2 to the drains of the transistors M61, M62, respectively. The sources of the transistors M61, M62 are connected in common. The drain of transistor M63 is connected to the source common coupled point. The gate of transistor M63 is connected to the drain of transistor M61 and the source of transistor 63 is connected to the ground GND. One electrode of the capacitor C is connected to the drain of transistor M62, whose output current is integrated by the capacitor C, which outputs the integrated voltage Vout.

The output voltage Vout is inputted to another gm circuit. A suitable number of units of such an integrator are combined to form a filter circuit.

The current sources 31, 32 connected to the power supply Vcc supply the constant currents Ib1, Ib2 to the transistors M61 and M62, respectively, thereby biasing the transistors, which keeps the current flowing through transistor M61 at a constant value of Ib1 at all times. The drain current ratio of the differential transistor pair of M61 and M62 is almost determined by the differential voltage between the differential input signals Vin1 and Vin2. As a result, feedback is applied to the gate of transistor M63 so that the drain current of transistor M61 may become Ib1 with respect to a certain differential voltage between the voltages Vin1 and Vin2. Since the current flowing in transistor M61 is constant, the gate-source voltage $V_{GS1}$ of transistor M61 is always constant, regardless of the input and the source connection end voltage of the transistors M61 and M62 is always fixed at a voltage lower than Vin1 by a specific voltage. This means that transistor M62 is biased with transistor M61. If the transistors M61 and M62 have the same size and shape, the DC of transistor M62 will become equal to Ib1.

Furthermore, the differential voltage between the voltages Vin1 and Vin2 is all applied to transistor M62, with the result that the gm circuit is performing voltage-current conversion only with transistor M62 from the viewpoint of alternating current. The role of transistor M61 is to reject the common mode voltages in the differential input with the differential circuit configuration including transistor M62 and to bias transistor M62. Since the current flowing in transistor M62 is Ib1, making the constant current Ib2 supplied to the drain of transistor M62 equal to Ib1 causes the drain of transistor M62 to output the current dependent only on the signal component of the input voltage. The current is integrated by the capacitor C connected to the output terminal, which outputs the integrated voltage Vout.

It is assumed that the transistors M61 and M62 have the same size and shape and are both operating in the saturation region (pinch-off region). For the sake of simplicity, the short channel effect is not taken into consideration. In this case, the relationship between the differential input signals Vin1 and Vin2 and output current Iout can be expressed by the following equations:

$$M61: Id62=(k/2)(V_{GS1}-Vth)^2 \quad (23)$$

$$M62: Id62 = (k/2)(Vin2 - Vin1 + V_{GS1} - Vth)^2 \quad (24)$$
$$= (k/2)(-Vin + \sqrt{(2Ib/k)})^2$$

where Vin=Vin1−Vin2 and Ib1=Ib2=Ib.
Consequently, $$Iout=Ib-Id62=Vin\sqrt{(2kIb)}-(k/2)Vin^2 \quad (25)$$

In this way, the relationship between the input voltage Vin and output current Iout of the gm circuit of FIG. 14 can be simply expressed by equation (25). In the equation, since the square term of Vin is in the second term, there is some distortion. However, the second terms can be assumed to be sufficiently smaller than the first term under the following condition:

$$|Vin|<<\sqrt{(2Ib/k)}$$

On this assumption, the second term is removed and equation (25) is approximated to the following expression:

$$Iout\approx Vin\sqrt{(2kIb)} \quad (26)$$

That is, in the very small amplitude region, the output current Iout is proportional to the input voltage Vin. At this time, gm is expressed as:

$$gm=\sqrt{(2kIb)}$$

Since the gm circuit does not use a returning circuit, such as a current mirror, it has a good frequency characteristic and is suitable for a high-frequency filter circuit. Furthermore, even when the gm circuit is used with the drain voltage of transistor M63 dropped close to the ground GND, there is no problem. Thus, the gm circuit is suitable for a low-voltage IC filter. Moreover, since the drain voltage of transistor M61 is almost constant, a resistance may be inserted between the power supply Vcc and the drain of transistor M61 in place of the current source 31 and used as a constant current source.

While in the example of FIG. 15, the basic differential transistors have been composed of NMOS transistors, the NMOS transistors may be replaced with PMOS transistors, the power supply Vcc be replaced with the ground GND, and the ground GND be replaced with the power supply Vcc, which will achieve the same operation. Although the circuit has been explained on the assumption that the differential input signals Vin1 and Vin2 are inputted to the input terminals 33, 34, respectively, an input signal varying with time may be supplied to only one of the input terminals 33, 34 and a bias voltage equal to, for example, the DC component of the input signal be supplied to the other input terminal.

[Third Embodiment]

In the gm circuit of FIG. 16, a level shift circuit LS is inserted between the drain of transistor M61 and the gate of transistor M63 in the circuit of FIG. 15. The circuit of FIG. 15 is based on the assumption that the transistors M61 and M62 operate in the saturation region. The current necessary for transistor M63 determines the gate-source voltage of transistor M63, which then determines the drain voltage of transistor M61. When the level of the input signal Vin1 is high, the source connection end voltage of transistor M61 rises, causing a problem: transistor M61 cannot secure a sufficient drain-source voltage. This problem narrows the dynamic range of the input and therefore decreases the linear range.

To avoid the problem, the level shift circuit LS is provided. Use of the level shift circuit LS causes the drain voltage of transistor M61 to rise by the level shift voltage, giving so much more margins to the drain-source voltage of transistor M61, which suppresses a decrease in the linear range.

Figure 17:
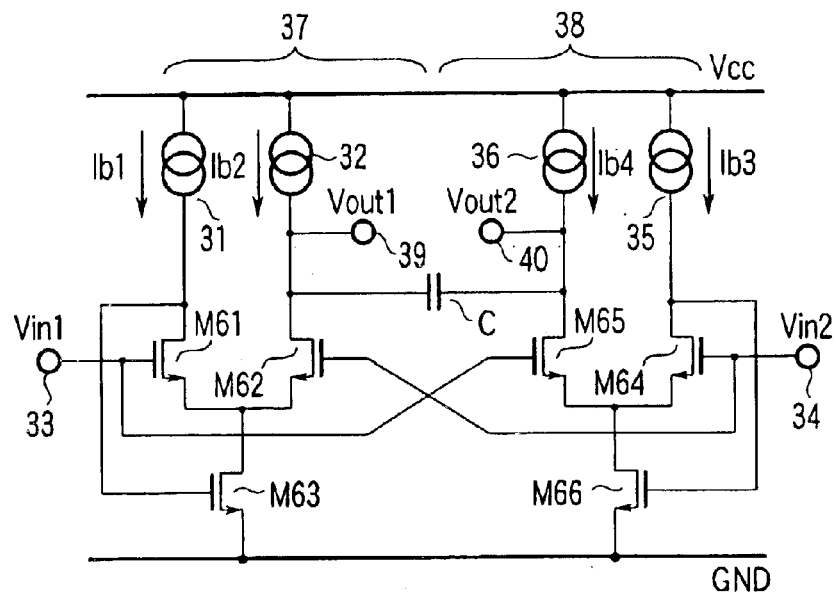

FIG. 17 shows a gm circuit used in a filter circuit according to a second embodiment of the present invention. In FIG. 17, two units of the circuit of FIG. 15 are connected in parallel, with the input terminals cross-coupled with each other, thereby forming a complete differential-type gm circuit. Specifically, the gm circuit is composed of a first differential circuit 37 made up of transistors M61 to M63 and current sources 31 and 32 and a second differential circuit 38 made up of transistors M64 to M66 and current sources 35 and 36. The gates of the transistors M61 and M65 are connected to an input terminal 33, to which the positive signal Vin1 of a differential input is supplied. The gates of the transistors M62 and M64 are connected to an input terminal 34, to which the negative signal Vin2 of the differential input is supplied. A capacitor C is connected between the output terminal 39 of the first differential circuit 37 and that of the second differential circuit 38. The capacitor C integrates the drain currents Iout+ and Iout− of the transistors M62 and M65 and produces output voltages Vout1 and Vout2 at the output terminals 39 and 40.

With the above configuration, the drain currents Iout+ and Iout− of the transistors M62 and M65 can be expressed by the following equations using equation (24):

$$M62: Iout-=(k/2)(-Vin+\sqrt{(2Ib/k)})^2 \quad (27)$$

$$M65: Iout+=(k/2)(Vin+\sqrt{(2Ib/k)})^2 \quad (28)$$

where Ib1=Ib2=Ib3=Ib4=Ib.
Calculating the output differential current Iout+−Iout− gives:

$$I_{out+} - I_{out-} = V_{in} \times \sqrt{(8kI_b)} \quad (29)$$

The current flows through the capacitor C. This equation indicates that the output differential current is completely proportional to the input voltage Vin. Therefore, if the input signal has no distortion, current proportional to the input voltage and completely free from distortion components will flow through the capacitor C. Since equation (29) always holds under the condition that each transistor operates in the saturation region, the gm circuit has a wide linear range with respect to the input voltage. The conversion coefficient (or transconductance) gm of the input voltage into the output current is determined by k and Ib as follows:

$$gm = \sqrt{(8kI_b)} \quad (30)$$

As seen from the equation, gm is proportional to the square root of the bias current Ib. Thus, varying the bias current enables gm to be controlled and therefore the frequency characteristic of the filter to be adjusted. Because the circuit supplies a differential input signal to the differential circuit of each of the transistors M61, M62, and M64 and M65, the in-phase component of the input signal is rejected by each differential circuit, thereby maintaining the high common mode rejection capability on the whole. Furthermore, the circuit of FIG. 17 has all the advantages explained in the circuit of FIG. 15, including the excellent high-frequency characteristic and the suitability for low-voltage operation.

Figure 18:
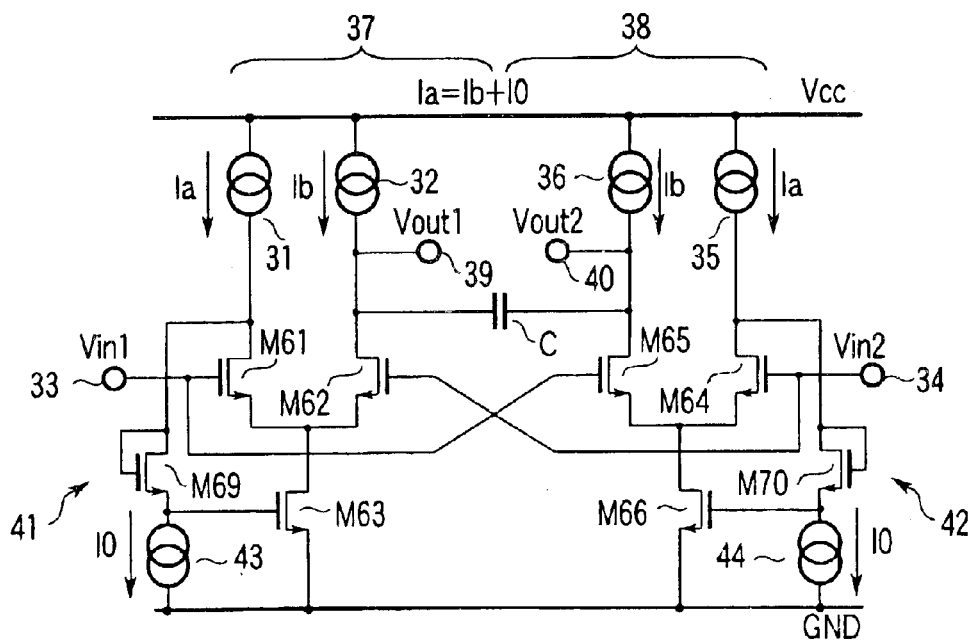
FIG. 18 is a circuit diagram of a modification of the circuit shown in FIG. 17.

FIG. 18 shows a modification of the circuit of FIG. 17. The modified point is that circuits of the type shown in FIG. 16 are used as the two differential circuits 37, 38 of the input stage. Specifically, the level shift circuits 41 and 42 shift the drain voltages of the transistors M61 and M64 by a specific voltage and supply the level-shifted voltages as the gate voltages of the transistors M63 and M66 supplying current to the differential circuits 37, 38. This makes the linear operation range of the two differential circuits 17, 18 of the input stage still wider.

The level shift circuits 41 and 42 are composed of transistors M69 and M70 whose drain and gate are short-circuited and current sources 43 and 44, respectively. The gate-source voltage generated by causing the current sources 43, 44 to supply current I0 to the respective transistors M69, M70 is used to shift the level by the gate-source voltage. At this time, the current sources 31, 35 for supplying current from the power supply Vcc side to the differential circuits 37, 38 have a current value of Ia (Ia=Ib+Io) obtained by adding a level shift current of Io to the current Ib of the current sources 32, 36.

While in this example, transistors have been used for level shifting, resistances may be used instead of the transistors M69 and M70 for level shifting, which produces the same effect.

Figure 19:
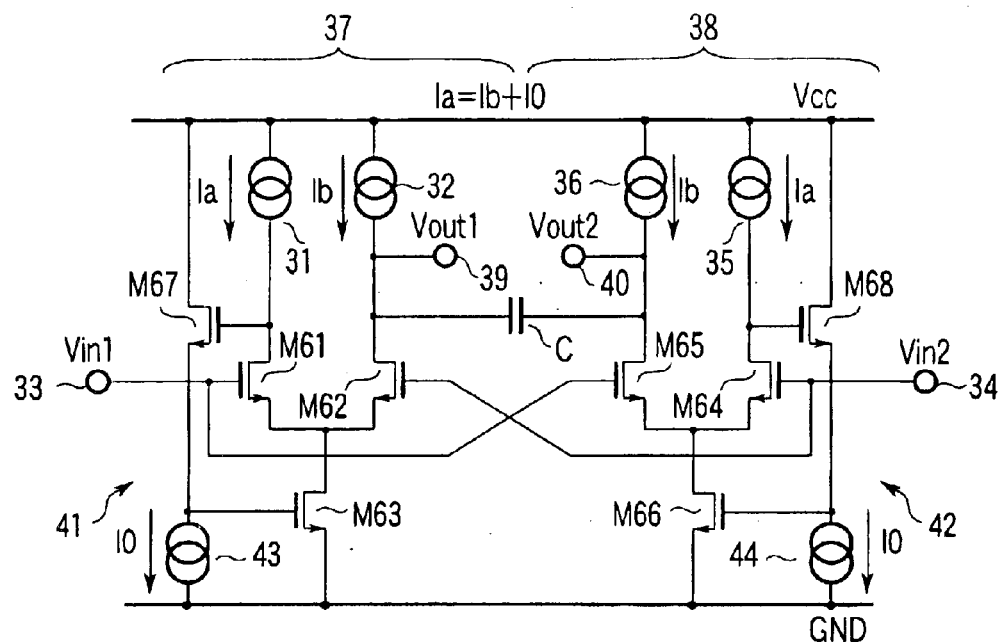
FIG. 19 is a circuit diagram of a modification of the level shift circuit in the circuit of FIG. 18.

As shown in FIG. 19, the level shift circuits 41, 42 are composed of NMOS transistors M67 and M68 and current sources 43 and 44 as are those in the FIG. 13, which achieves still higher accuracy.

[Third Embodiment]

Figure 20:
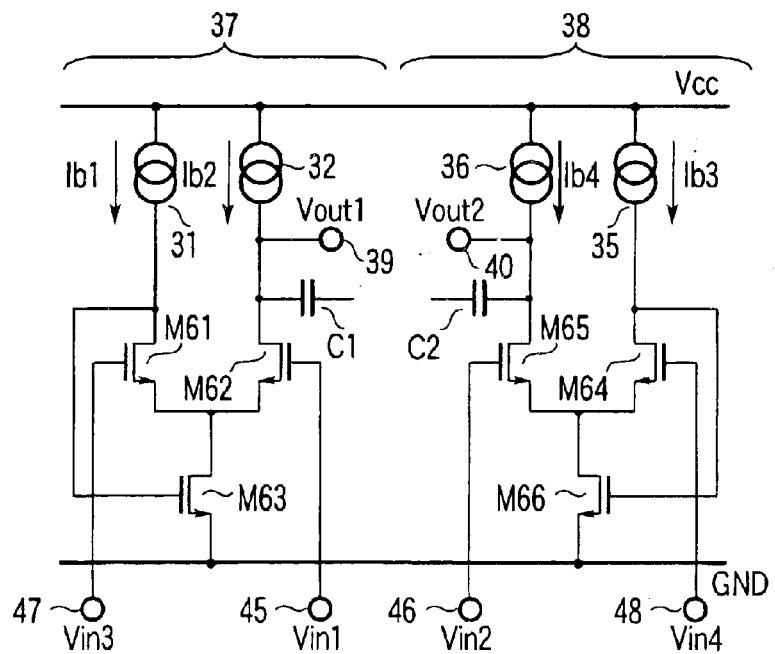
FIG. 20 is a circuit diagram showing the configuration of a differential amplifier used as a transconductance circuit in a filter circuit to help explain a third embodiment of the present invention.

FIG. 20 shows a gm circuit used in a filter circuit according to a third embodiment of the present invention. The circuit of FIG. 20 is the same at that of the second embodiment in that two differential circuits 37 and 38 are connected in parallel to form a complete differential-type circuit. The former, however, differs from the latter in that two sets of differential input signals are inputted and one set of differential output signals is obtained. Specifically, the gate of transistor M62 in the first differential circuit 37 is connected to an input terminal 45 and the gate of transistor M65 in the second differential circuit 38 is connected to an input terminal 46. First differential input signals Vin1, Vin2 are inputted to these input terminals 45, 46, respectively. In addition, the gate of transistor M61 in the first differential circuit 37 is connected to an input terminal 47 and the gate of transistor M64 in the second differential circuit 38 is connected to an input terminal 48. Second differential input signals Vin3, Vin4 are inputted to these input terminals 47, 48, respectively. One-side electrodes of capacitors C1 and C2 are connected to output terminals 39 and 40, respectively. Differential output signals Vout1 and Vout2 are outputted at the output terminals 39 and 40.

As a modification of the circuit in FIG. 20, level shift circuits as shown in FIGS. 18 and 19 may be inserted between the drains of the transistors M61, M64 and the gates of the transistors M63, M66, respectively.

While each of the circuits shown in FIGS. 17 to 19 is a gm circuit including a set of differential inputs and a set of differential output, the circuit of the fifth embodiment is a gm circuit including two sets of differential inputs and a set of differential outputs. In this circuit, the gm value for each differential input is half of equation (30). In addition to this, the circuit of FIG. 20 differs from each of the circuits of FIGS. 17 to 19 whose gm circuit has the common mode rejection capability in that the differential output has a high negative common mode gain for the first differential input signals Vin1, Vin2 and a high positive common mode gain for the second differential input signals Vin3, Vin4. Taking advantage of the high common mode gain, a filter circuit is constructed to apply self-bias, which eliminates a common-mode feedback circuit necessary as a bias circuit for a complete differential-type filter circuit. As many common-mode feedback circuits as corresponds to the degree of the filter are needed and occupy a large portion of the entire filter circuit. Therefore, the elimination of those feedback circuits produces a great effect.

Figure 21:
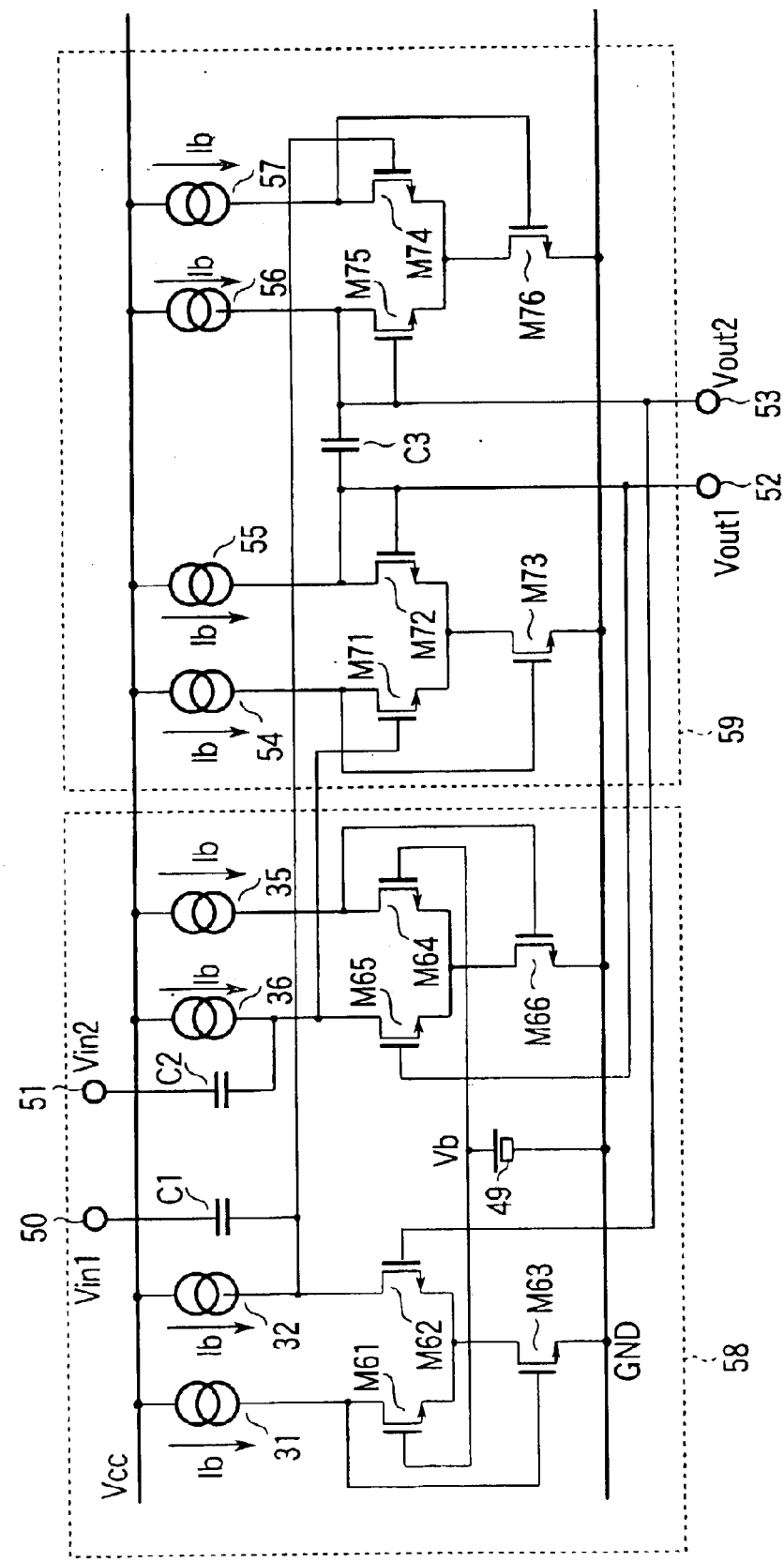
FIG. 21 is a circuit diagram of a concrete configuration of a secondary BPF (band-pass filter) using the differential amplifier of FIG. 19.

FIG. 21 shows a secondary BPF (band-pass filter) using the gm circuit of FIG. 20. The BPF comprises a first unit integrator 58 and a second unit integrator 59. The first unit integrator 58 is composed of transistors M61 to M66, constant-current sources 31, 32, 35, 36, a DC power supply 49, and capacitors C1 and C2. The second unit integrator 59 is composed of transistors M71 to M76, constant-current sources 54 to 57, and a capacitor C3.

In the first unit integrator 58, differential output signals Vout1 and Vout2 are fed back from output terminals 52 and 53 to the gates of the transistors M65 and M62 and the DC source 49 applies a reference voltage of Vb to the gates of the transistors M61 and M64. In the second unit integrator 59, the differential output signals Vout1 and Vout2 are fed back from the output terminals 52 and 53 to the gates of the transistors M72 and M75 and the differential output signals at the drains of the transistors M62, M65 of the first unit integrator 58 are supplied to the gates of the transistors M74, M71. Differential input signals Vin1 and Vin2 at input terminals 50 and 51 are supplied via capacitors C1 and C2 to the drains of the transistors M62 and M65 in the first unit integrator 58.

With this configuration, the in-phase component in the differential output of the first unit integrator 58 is amplified in a noninverting manner at the second unit integrator 59. The amplified in-phase component returns to the input of the first unit integrator 58, which amplifies it in an inverting manner and feeds back the resulting signal to the output of the first unit integrator 58. In this way, since the common mode gain as a whole serves as negative feedback in the one-round loop, the DC value of the differential output signals Vout1, Vout2 outputted from the drains of the transistors M72, M75 of the second unit integrator 59 is controlled so that they may be equal to the reference voltage Vb, the second differential input to the first unit integrator 58. In this way, the output voltage can be stabilized only by the feedback operation of the gm circuit without using a special bias circuit. Moreover, each operating point voltage can be set using the reference voltage Vb independent of the voltage of the differential input signal.

Since the capacitors C1 and C2 connected to the output terminal of the first unit integrator 58 with a high gain also compensates for the phase of the loop, the common mode feedback loop is stable in operation up to the high-frequency region. With this configuration, the differential output signals Vout1, Vout2 obtained by filtering the differential input signal using the BPF characteristic can be taken out from the output terminals 52, 53.

In such a filter circuit, the filter characteristic can be set arbitrarily by selecting the capacitance of each of the capacitors C1, C2, and C3 and gm for each gm circuit. Since gm for each differential input is half of gm in equation (30), this gives:

$$gm = \sqrt{(2kIb)}$$

Therefore, the value of k and current Ib are selected according to the shape and size (W/L) of transistors constituting the gm circuit. Then, each gm value is set. The filter characteristic determined in this way can be adjusted by interlocking the current Ib of each of the current sources 31, 32, 35, 36, 54 to 57 with each other and keeping the ratio of these current values constant. In this case, the frequency characteristic moves along the frequency axis in proportion to the square root of the value of current Ib. The filter circuit has therefore has the advantage that it can adjust the frequency characteristic easily.

FIG. 22 shows changes in the frequency characteristic of the BPF when current Ib is changed from 10 $\mu$A to 100 $\mu$A in the filter circuit of FIG. 21.

FIG. 23 is a circuit diagram showing a more concrete configuration of the secondary BPF (band-pass filter) of FIG. 21. In the circuit of FIG. 23, the current sources 31, 32, 35, 36, 54, 55, 56, 57 in the circuit of FIG. 21 are composed of NMOS transistors M100 to M107 and a variable DC power supply Vs applies a bias voltage to the gates of these transistors M100 to M107.

With this configuration, changing the voltage of the variable DC power supply Vs causes the currents of the individual current sources 31, 32, 35, 36, 54, 55, 56, 57 to change in the same ratio. Specifically, by changing the current values of the current sources 31, 32, 35, 36, 54, 55, 56, 57, while keeping the ratio of the current values constant, the integration constants of the first and second unit integrators 58, 59 can be adjusted.

The configuration where the current sources are composed of NMOS transistors and the variable DC power supply applies the bias voltage to the gates of these transistors can be applied to the current sources in the above-described embodiments. For instance, the current values of the current sources 15 and 16 in the differential amplifier of the first embodiment in FIG. 6 may be changed in the same ratio to control the gain.

[Fourth Embodiment]

FIG. 24 shows a gm circuit used in a filter circuit according to a fourth embodiment of the present invention. In FIG. 24, two units of the circuit of FIG. 15 are connected in parallel, with the input terminals cross-coupled with each other, thereby forming a gm circuit. In this respect, the fourth embodiment is the same as the second embodiment of FIG. 17. Specifically, the gm circuit is composed of a first differential circuit 37 made up of transistors M61 to M63 and a current source 31 and a second differential circuit 38 made up of transistors M64 to M66 and a current source 35. The gates of the transistors M61 and M65 are connected to an input terminal 33, to which the positive signal Vin1 of a differential input signal is supplied. The gates of the transistors M62 and M64 are connected to an input terminal 34, to which the negative signal Vin2 of the differential input signal is supplied.

As a modification of the circuit in FIG. 24, level shift circuits as shown in FIGS. 18 and 19 may be inserted between the drains of the transistors M61, M64 and the gates of the transistors M63, M66, respectively.

The gm circuit of FIG. 24 differs from the gm circuit of FIG. 17 in that a current mirror circuit 60 is provided, the output current Iout of the second differential circuit 38 outputted from transistor M65 is returned by the current mirror and caused to flow to the drain of transistor M62, thereby doing subtraction of the output current Iout of the second differential circuit 38 and the output current Iout of the first differential circuit 37 to produce a differential signal. Then, the differential signal is inputted to the integrating capacitor C, which produces an integration voltage Vout at the output terminal 61. Accordingly, the circuit is a gm circuit with a set of differential inputs and a single output.

Figure 25:
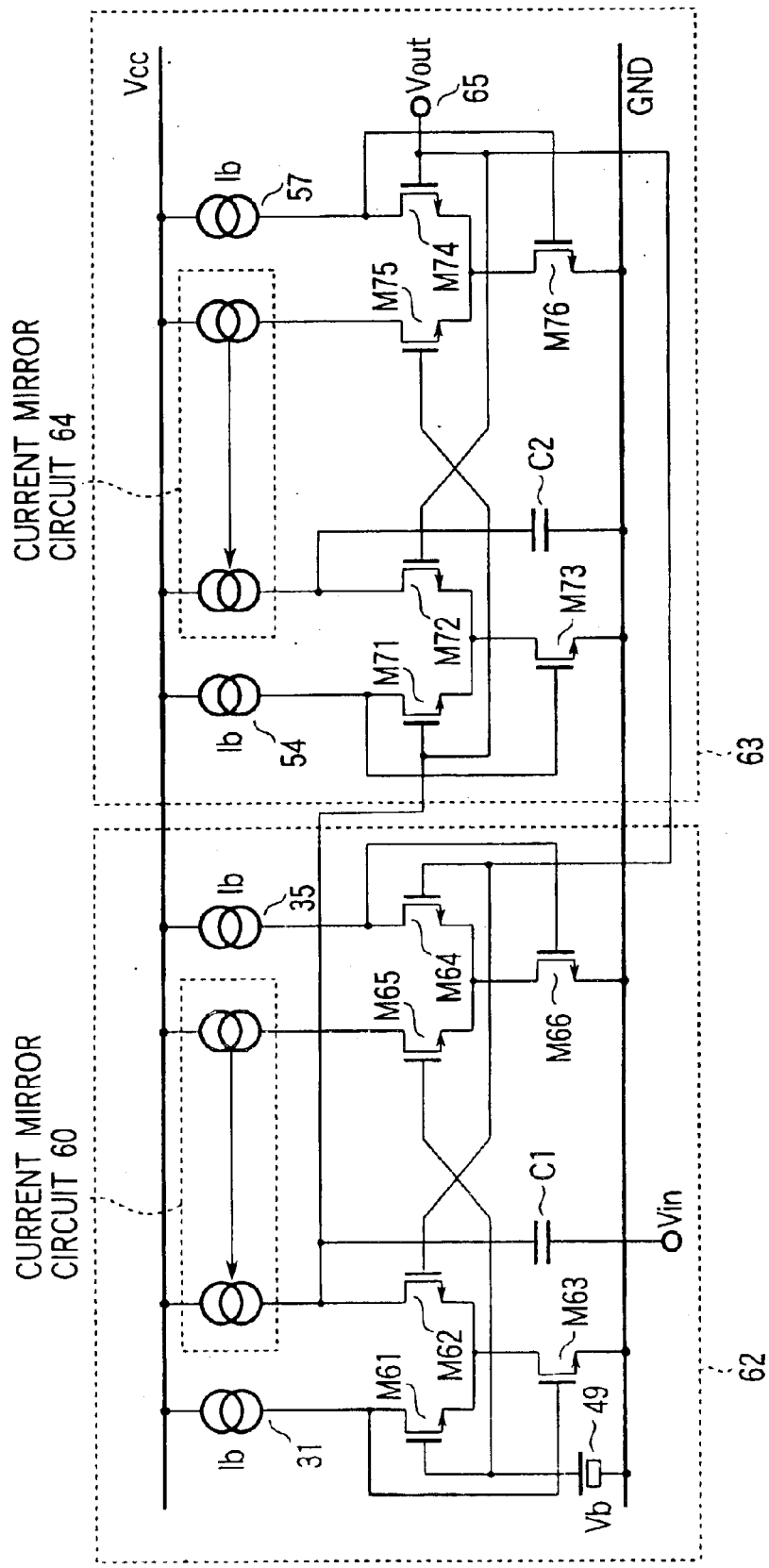
FIG. 25 is a circuit diagram of a concrete configuration of a secondary BPF (band-pass filter) using the differential amplifier of FIG. 24.

FIG. 25 shows a secondary BPF (band-pass filter) using the gm circuit of FIG. 24. The BPF comprises a first unit integrator 62 and a second unit integrator 63. The first unit integrator 62 is composed of transistors M61 to M66, constant-current sources 31, 35, a DC power supply 49, a capacitor C1, and a current mirror circuit 60. The second unit integrator 63 is composed of transistors M71 to M76, constant-current sources 54 and 57, a capacitor C3, and a current mirror circuit 64.

The DC source 49 applies a reference voltage of Vb to the gates of the transistors M61 and M65 in the first unit integrator 62. The output voltage Vout at the output terminal 65 is fed back to the gates of the transistors M62 and M64. In addition, the output at the drain of transistor M62 of the first unit integrator 62 is supplied to the gates of the transistors M71, M75 of the second unit integrator 63. The output voltage Vout at the output terminal 65 is fed back to the gates of the transistors M72 and M74 of the second unit integrator 63. Then, the input signal Vin is supplied via the capacitor C1 to the output terminal (or the drain of transistor M62) of the first unit integrator 62.

In the filter of such a single configuration, the common mode voltage need not be taken into account, differently from the complete differential configuration as shown in FIG. 21. The single configuration enables the output signal Vout obtained by filtering the input signal Vin using the BPF characteristic to be outputted at the output terminal 65 (or the gate of transistor M72).

As with the filter circuit according to the third embodiment of FIG. 21, the filter characteristic determined in this way can be controlled by inter-locking the individual currents Ib with each other, which enables the frequency characteristic to be adjusted in proportion to the square root of current Ib.

Figure 26:
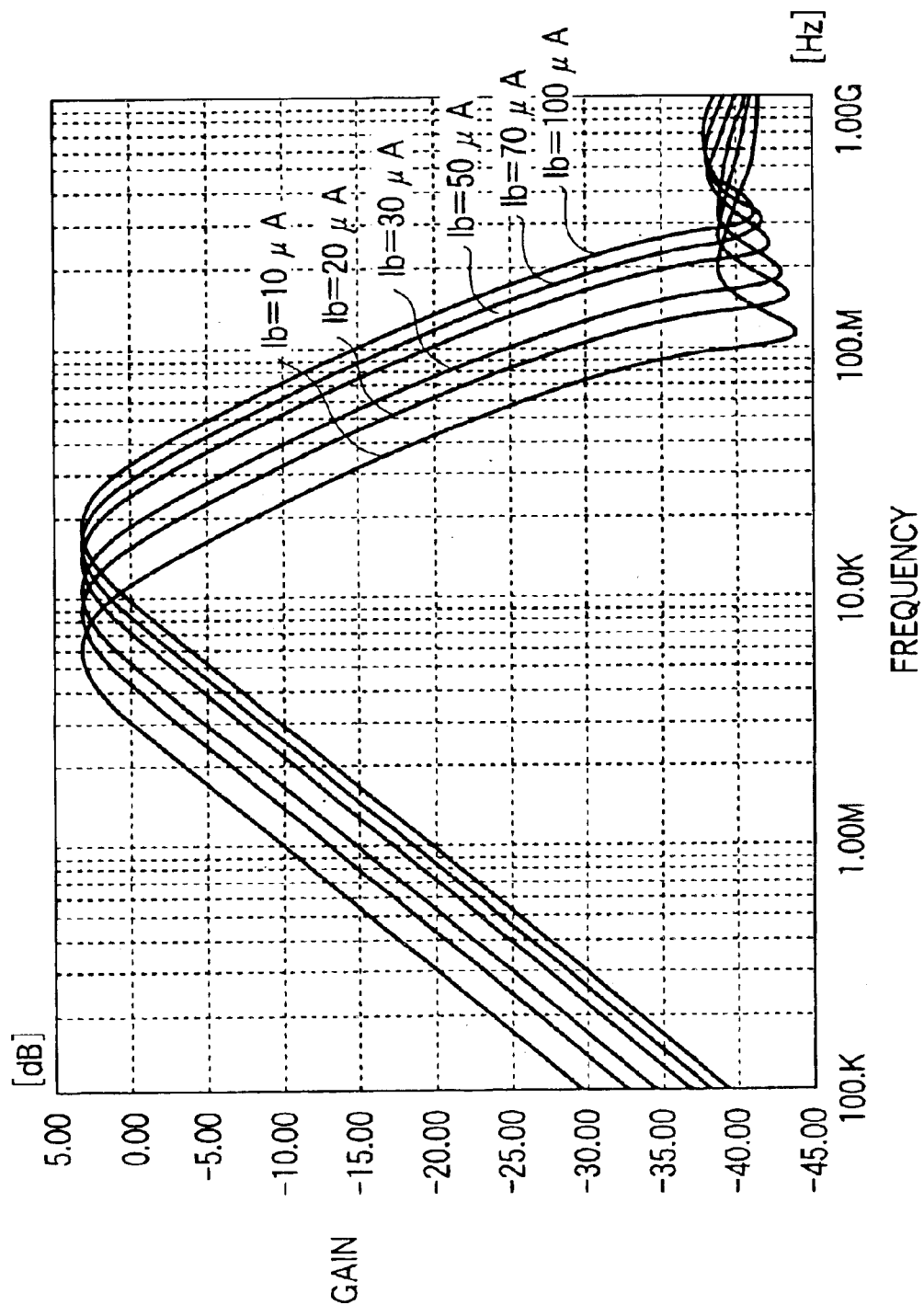
FIG. 26 is a characteristic diagram showing the frequency characteristic of the filter circuit shown in FIG 25.
Figure 27:
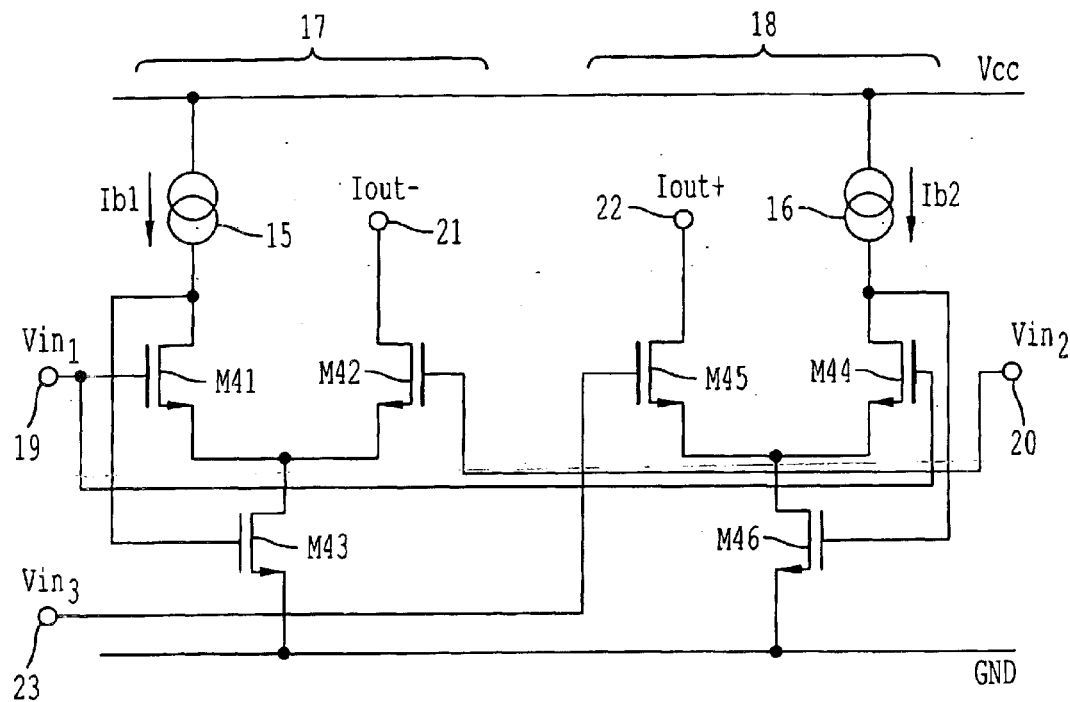
FIGS. 27 and 28 are circuit diagrams of modifications of the differential amplifier shown in FIG. 6.
Figure 28:
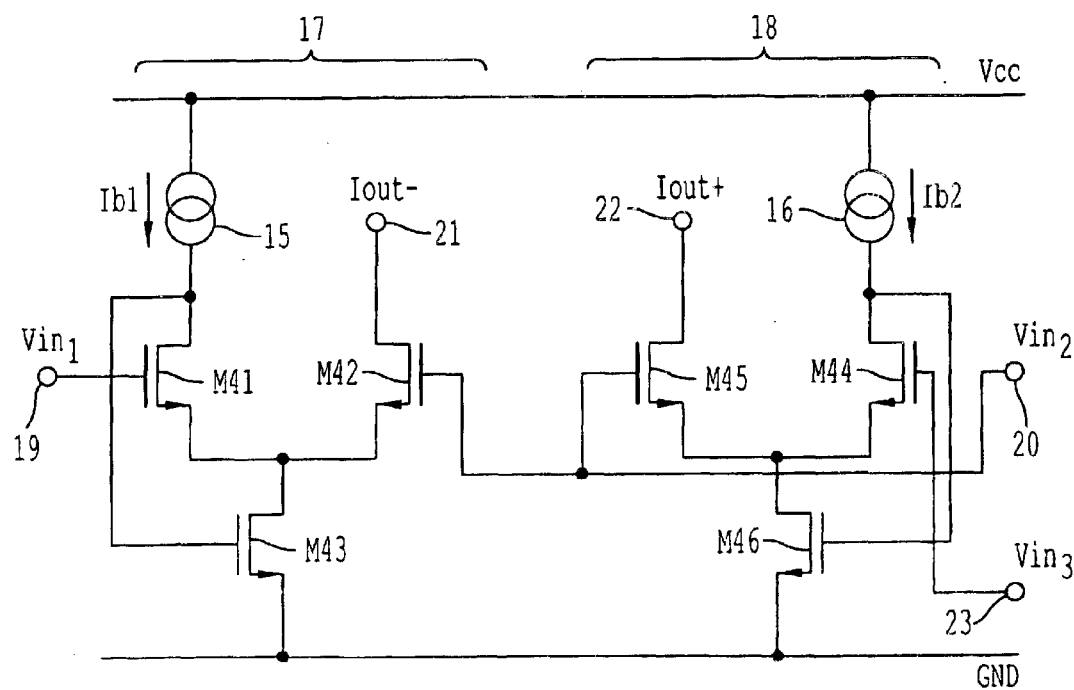

FIG. 26 shows changes in the frequency characteristic of the BPF when current Ib is changed from 10 $\mu$A to 100 $\mu$A in the filter circuit of FIG. 25.

While in the above embodiments and modifications, all the basic component parts of the circuits have been composed of NMOS transistors, the NMOS transistors may be replaced with PMOS transistors, the power supply be replaced with the ground GND, and the ground GND be replaced with the power supply Vcc. In this case, too, a PMOS transconductance circuit (or differential amplifier) and a filter circuit are constructed in the same manner. It goes without saying that, from a functional viewpoint, the circuit composed of such PMOS transistors operates in the same manner as the circuit composed of NMOS transistors, which produces the same effect.

As has been explained, according to the present invention, there is provided a differential amplifier which has not only the advantage of making a wide linear range compatible with a high common mode rejection ratio but also the advantages of less deterioration of the linearity due to variations in the manufacture of elements, an excellent linearity even in the high-frequency region, a small circuit size, and a small dissipation current. This makes the utility value of the differential amplifier very high as a multipurpose differential amplifier. The ratio of the output amplitude to the input amplitude can be controlled by changing the current value of the current source or the current values of the first and second current sources in the differential amplifiers.

In a filter circuit that uses the differential amplifier as a transconductance circuit, use of a new-type gm circuit with low distortion and a wide linear range makes the filter circuit have an excellent linearity over both of the low-frequency and high-frequency regions, and suitable for operation at a low voltage. Moreover, the filter circuit is versatile when it is built in an integrated circuit, which makes its utility value high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A differential amplifier comprising:
   a first current source one end of which is connected to a power supply or a ground;
   a first MOS transistor of a first conductivity type whose drain is connected to the other end of said first current source and whose gate is connected to a first input terminal;
   a second MOS transistor of the first conductivity type whose source is connected to a source of said first MOS transistor and whose gate is connected to a second input terminal;
   a third MOS transistor of the first conductivity type whose drain is connected to the sources of said first and second MOS transistors, whose source is connected to the ground or the power supply, and whose gate is coupled to the other end of said first current source;
   a second current source one end of which is connected to the power supply or the ground;
   a fourth MOS transistor of the first conductivity type whose drain is connected to the other end of said second current source and whose gate is connected to said first input terminal;
   a fifth MOS transistor of the first conductivity type whose source is connected to a source of said fourth MOS transistor and whose gate is connected to a third input terminal; and
   a sixth MOS transistor of the first conductivity type whose drain is connected to the sources of said fourth and fifth MOS transistors, whose source is connected to the ground or the power supply, and whose gate is coupled to the other end of said second current source, wherein
   a differential signal is inputted to said second and third input terminals, a voltage substantially equal to the DC voltage of said differential signal is inputted to said first input terminal, and a differential output is obtained from drains of said second and fifth MOS transistor.

2. The differential amplifier according to claim 1, further comprising a first level shift circuit provided between the other end of said first current source and the gate of said third MOS transistor and a second level shift circuit provided between the other end of said second current source and the gate of said sixth MOS transistor.

3. The differential amplifier according to claim 1, further comprising a first resistance one end of which is connected to the power supply or the ground and the other end of which is connected to the drain of said second MOS transistor and a first output terminal and a second resistance one end of which is connected to the power supply or the ground and the other end of which is connected to the drain of said fifth MOS transistor and a second output terminal, wherein the differential output is obtained from said first and second output terminals.

4. A differential amplifier comprising:
   a first current source one end of which is connected to a power supply or a ground;
   a first MOS transistor of a first conductivity type whose drain is connected to the other end of said first current source and whose gate is connected to a first input terminal;
   a second MOS transistor of the first conductivity type whose source is connected to a source of said first MOS transistor and whose gate is connected to a second input terminal;
   a third MOS transistor of the first conductivity type whose drain is connected to the sources of said first and second MOS transistors, whose source is connected to the around or the power supply, and whose gate is coupled to the other end of said first current source;
   a second current source one end of which is connected to the power supply or the ground;
   a fourth MOS transistor of the first conductivity type whose drain is connected to the other end of said second current source and whose gate is connected to said first input terminal;
   a fifth MOS transistor of the first conductivity type whose source is connected to a source of said fourth MOS transistor and whose gate is connected to a third input terminal;
   a sixth MOS transistor of the first conductivity type whose drain is connected to the sources of said fourth and fifth MOS transistors, whose source is connected to the ground or the power supply, and whose gate is coupled to the other end of said second current source; and
   a current mirror circuit where one of the drains of said second and fifth MOS transistors serves as an input node and the other of the drains serves as an output node, wherein
   the output is obtained from the output node of said current mirror circuit.

5. The differential amplifier according to claim 1, wherein a gain is controlled by changing current values of said first current source and second current source in substantially the same ratio.

6. A differential amplifier comprising:

a first current source one end of which is connected to a power supply or a ground;

a first MOS transistor of a first conductivity type whose drain is connected to the other end of said first current source and whose gate is connected to a first input terminal;

a second MOS transistor of the first conductivity type whose source is connected to a source of said first MOS transistor and whose gate is connected to second input terminal;

a third MOS transistor of the first conductivity type whose dram is connected to the sources of said first and second MOS transistors, whose source is connected to the ground or the power supply, and whose gate is coupled to the other end of said first current source;

a second current source one end of which is connected to the power supply or the ground;

a fourth MOS transistor of the first conductivity type whose drain is connected to the other end of said second currently source and whose gate is connected to a third input terminal;

a fifth MOS transistor of the first conductivity type whose source is connected to a source of said fourth MOS transistor and whose gate is connected to said second input terminal; and a sixth MOS transistor of the first conductivity type whose drain is connected to the sources of said fourth and fifth MOS transistors, whose source is connected to the ground or the power supply, and whose gate is coupled to the other end of said second current source, wherein a differential signal is inputted to said first and third input terminals, a voltage substantially equal to the DC voltage of said differential signal is inputted to said second input terminal, and a differential output is obtained from drains of said second and fifth MOS transistors.

7. The differential amplifier according to claim 6, further comprising a first level shift circuit provided between the other end of said first current source and the gate of said third MOS transistor and a second level shift circuit provided between the other end of said second current source and the gate of said sixth MOS transistor.

8. The differential amplifier according to claim 6, further comprising a first resistance one end of which is connected to the power supply or the ground and the other end of which is connected to the drain of said second MOS transistor and a first output terminal and a second resistance one end of which is connected to the power supply or the ground and the other end of which is connected to the drain of said fifth MOS transistor and a second output terminal, wherein the differential output is obtained from said first and second output terminals.

9. A differential amplifier comprising:

a first current source one end of which is connected to a power supply or a ground;

a first MOS transistor of a first conductivity type whose drain is connected to the other end of said first current source and whose sate is connected to a first input terminal;

a second MOS transistor of the first conductivity type whose source is connected to a source of said first MOS transistor and whose gate is connected to second input terminal;

a third MOS transistor of the first conductivity type whose drain is connected to the sources of said first and second MOS transistors, whose source is connected to the ground or the power supply, and whose gate is coupled to the other end of said first current source;

a second current source one end of which is connected to the power supply or the ground;

a fourth MOS transistor of the first conductivity type whose drain is connected to the other end of said second currently source and whose gate is connected to a third input terminal;

a fifth MOS transistor of the first conductivity type whose source is connected to a source of said fourth MOS transistor and whose sate is connected to said second input terminal;

a sixth MOS transistor of the first conductivity type whose drain is connected to the sources of said fourth and fifth MOS transistors, whose source is connected to the around or the power supply, and whose sate is coupled to the other end of said second current source; and a current mirror circuit where one of the drains of said second and fifth MOS transistors serves as an input node and the other of the drains serves as an output node, wherein the output is obtained from the output node of said current mirror circuit.

10. The differential amplifier according to claim 6, wherein a gain is controlled by changing current values of said first current source and second current source in substantially the same ratio.

* * * * *